US006780790B2

(12) United States Patent
Shioya et al.

(10) Patent No.: US 6,780,790 B2
(45) Date of Patent: Aug. 24, 2004

(54) SEMICONDUCTOR DEVICE AND METHOD OF MANUFACTURING THE SAME

(75) Inventors: Yoshimi Shioya, Tokyo (JP); Yuhko Nishimoto, Tokyo (JP); Tomomi Suzuki, Tokyo (JP); Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 10/287,549

(22) Filed: Nov. 5, 2002

(65) Prior Publication Data

US 2003/0109136 A1 Jun. 12, 2003

(30) Foreign Application Priority Data

Dec. 6, 2001 (JP) ...................................... 2001-372299
Apr. 26, 2002 (JP) ...................................... 2002-127388

(51) Int. Cl.[7] ........................ H01L 21/469; H01L 21/30
(52) U.S. Cl. ........................ 438/778; 438/780; 438/788
(58) Field of Search ................................ 438/778, 780, 438/787–790

(56) References Cited

U.S. PATENT DOCUMENTS

| 5,040,046 | A | 8/1991 | Chhabra et al. | ............... 357/54 |
| 5,314,724 | A | 5/1994 | Tsukune et al. | ............ 427/489 |
| 5,593,741 | A | 1/1997 | Ikeda | ........................ 427/579 |
| 6,051,321 | A | 4/2000 | Lee et al. | ................... 428/447 |
| 6,287,990 | B1 | 9/2001 | Cheung et al. | ............. 438/780 |

FOREIGN PATENT DOCUMENTS

| EP | 0881 678 A2 | 12/1998 |
| JP | 11-288931 | 10/1999 |
| WO | WO 98/50945 | 11/1998 |

OTHER PUBLICATIONS

Suzuki et al., U.S. 2001/0054605 A1, published Dec. 27, 2001.*
T. Ishimaru et al., "Development of Low–k Copper Barrier Films Deposited by PE–CVD Using HMDSO, N2O and NH3", 2001, pp36–38.
R. S. Muller et al., "Device Electronics for Integrated Circuits", Second Edition, pp102–103.
J.Shi et al., "Properties and Integration of Low k (k<3.0) PECVD Films", SEMICON Korea Technical Symposium 2000, pp279–283.

* cited by examiner

Primary Examiner—Ha Tran Nguyen
(74) Attorney, Agent, or Firm—Lorusso, Loud & Kelly

(57) ABSTRACT

A semiconductor device having a barrier insulating film covering a copper wiring is formed by a plasma enhanced CVD method. The method includes supplying high frequency power of a frequency of 1 MHz or more to a first electrode, and holding a substrate on which copper wiring is formed on a second electrode facing the first electrode; supplying a film forming gas containing an alkyl compound and an oxygen-containing gas between the first and second electrodes while regulating gas pressure of the film forming gas to 1 Torr or less; and supplying high frequency power to either of the first and second electrodes to convert the film forming gas into a plasma, and allowing the alkyl compound and the oxygen-containing gas of the film forming gas to react to form a barrier insulating film covering the surface of the substrate.

16 Claims, 16 Drawing Sheets

FIG. 2D

| | |
|---|---|
| ALKYL COMPOUND | ▭ |
| OXYGEN-CONTAINING GAS | ▭ |
| GAS PRESSURE | ( =<1Torr ) |
| HIGH FREQUENCY POWER | ▭ |
| LOW FREQUENCY POWER | ▭ |

FIG. 2E

| | |
|---|---|
| ALKYL COMPOUND | ▭ |
| OXYGEN-CONTAINING GAS | ▭ |
| GAS FLOW RATE | ◣ |
| GAS PRESSURE | ( =<1Torr ) |
| HIGH FREQUENCY POWER | ▭ |

FIG. 2F  DILUTION GAS 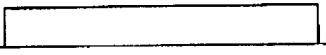
FIG. 2G  DILUTION GAS
         GAS FLOW RATE 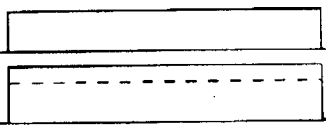
FIG. 2H  DILUTION GAS
         GAS FLOW RATE 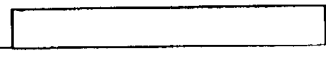
FIG. 2I  AMMONIUM GAS OR
         NITROGEN GAS 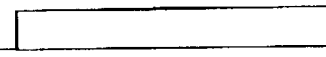
FIG. 2J  AMMONIUM GAS OR
         NITROGEN GAS 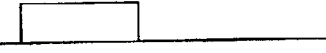
FIG. 2K  HYDROCARBON 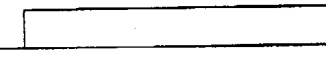

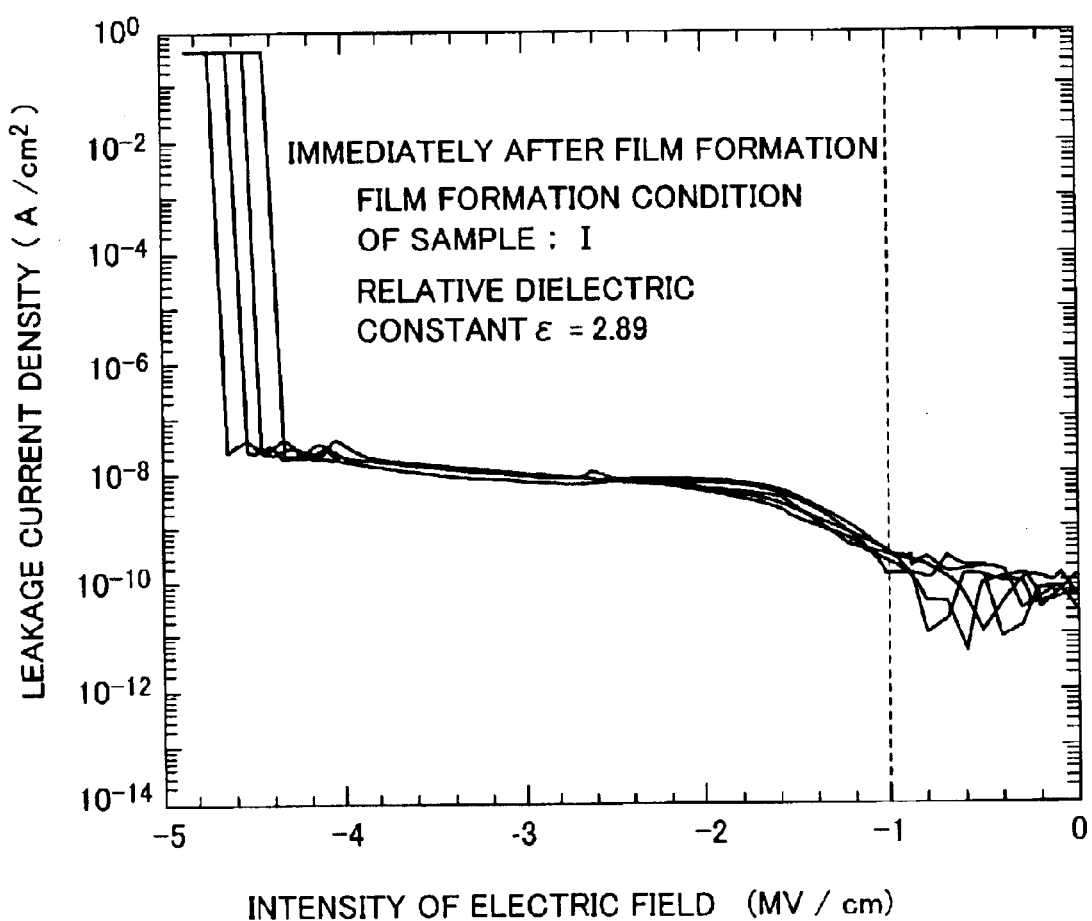

SEMICONDUCTOR DEVICE AND METHOD OF MANUFACTURING THE SAME

BACKGROUND OF THE INVENTION

1. Field of the Invention

The present invention relates to a method of manufacturing a semiconductor device, and more particularly to a method of manufacturing a semiconductor device in which a barrier insulating film for covering copper wiring is formed by use of a plasma enhanced CVD method.

2. Description of the Prior Art

In recent years, high speed in data transfer speed has been sought along with a high degree of integration and high density for semiconductor integrated circuits. Therefore, an insulating film having a low dielectric constant with a low RC delay (hereinafter referred to as a low dielectric constant insulating film) has been used.

On the other hand, with respect to a wiring material, copper (Cu) wiring having low electric resistance has come to be used instead of the conventional aluminum (Al) wiring.

Therefore, as an interlayer insulating film, a low dielectric constant insulating film is formed on copper wiring. When the low dielectric constant insulating film is formed after the formation of the copper wiring, or alternatively in steps after the formation of the copper wiring, annealing is performed at about 400 to about 450° C. Moreover, because a high field is applied to the interlayer insulating film during the operation of the semiconductor device, to prevent diffusion of copper into the low dielectric insulating film owing to heat and electric field, a barrier insulating film is sandwiched between the low dielectric constant insulating film and the copper wiring.

However, while a barrier insulating film is dense, it has a high relative dielectric constant. Among the various barrier insulating films, a SiC-based barrier insulating film shows a relatively low relative dielectric constant of about 5. However, when a barrier insulating film having a relative dielectric constant of 5 and a thickness of 100 nm is combined with a low dielectric constant insulating film having a thickness of 500 nm and a relative dielectric constant of 2.8, the relative dielectric constant of the interlayer insulating film as a whole becomes as high as 3.02.

Therefore, while an effort has been made to make the thickness of the barrier insulating film as thin as about 50 nm, the capability to prevent copper diffusion is thereby reduced.

SUMMARY OF THE INVENTION

The present invention relates to a semiconductor device having a barrier insulating film with a low relative dielectric constant, which covers wiring formed of a copper film or mainly formed of a copper film, and relates to a method of manufacturing the same. An object of the present invention is to provide a semiconductor device having a barrier insulating film with a low relative dielectric constant, which shows a small leak current and high capability to prevent copper diffusion, and to provide a method of manufacturing the same.

In the present invention, a film forming gas containing an alkyl compound and an oxygen-containing gas is supplied between first and second electrodes, and gas pressure is regulated to 1 Torr or less. Thereafter, high frequency power of a frequency of 1 MHz or more is applied to any one of the first and second electrodes, and the film forming gas is converted into a plasma. The plasmanized film-forming gases react with each other to form a barrier insulating film covering the copper wiring.

The use of the film forming gas converted into a plasma state by only high frequency power makes it possible to produce a low relative dielectric constant film. Moreover, it is possible to maintain sufficient denseness of the insulating film to prevent copper diffusion by controlling the pressure of the film forming gas to 1 Torr or less, at least at an early stage of the film formation.

To increase the denseness of the insulating film while maintaining a low relative dielectric constant, the film formation is carried out under a pressure for the film forming gas which is gradually elevated from low pressure to 1 Torr. Alternatively, ammonia ($NH_3$) and nitrogen ($N_2$) are added to the film forming gas, at least at the early stage of the film formation. Alternatively, the film forming gas may contain at least one of He and Ar as a dilution gas. The flow rate of the dilution gas may be increased at least in the early stage of the film formation. Alternatively, bias power of a low frequency is applied at the early stage of the film formation.

Moreover, hydrocarbon is added to the film forming gas to enhance etching selectivity for the etchant of the insulating film with the low relative dielectric constant, which is formed on the barrier insulating film.

As described above, according to the present invention, a barrier insulating film having a low relative dielectric constant can be formed while maintaining sufficient denseness to prevent copper diffusion.

BRIEF DESCRIPTION OF THE DRAWINGS

FIGS. 2A to 2K are charts of embodiments of the film forming method using particularly effective combinations of gases and effective combinations of film forming conditions.

FIG. 3 is a graph of leakage current versus intensity of electric field for a silicon-containing insulating film immediately after film formation (as depo.), under condition I according to a first embodiment of the present invention.

DESCRIPTION OF THE PREFERRED EMBODIMENTS

Embodiments of the present invention will be described below with reference to the accompanying drawings.

Description of a Plasma Enhanced CVD Apparatus

Figure 1:
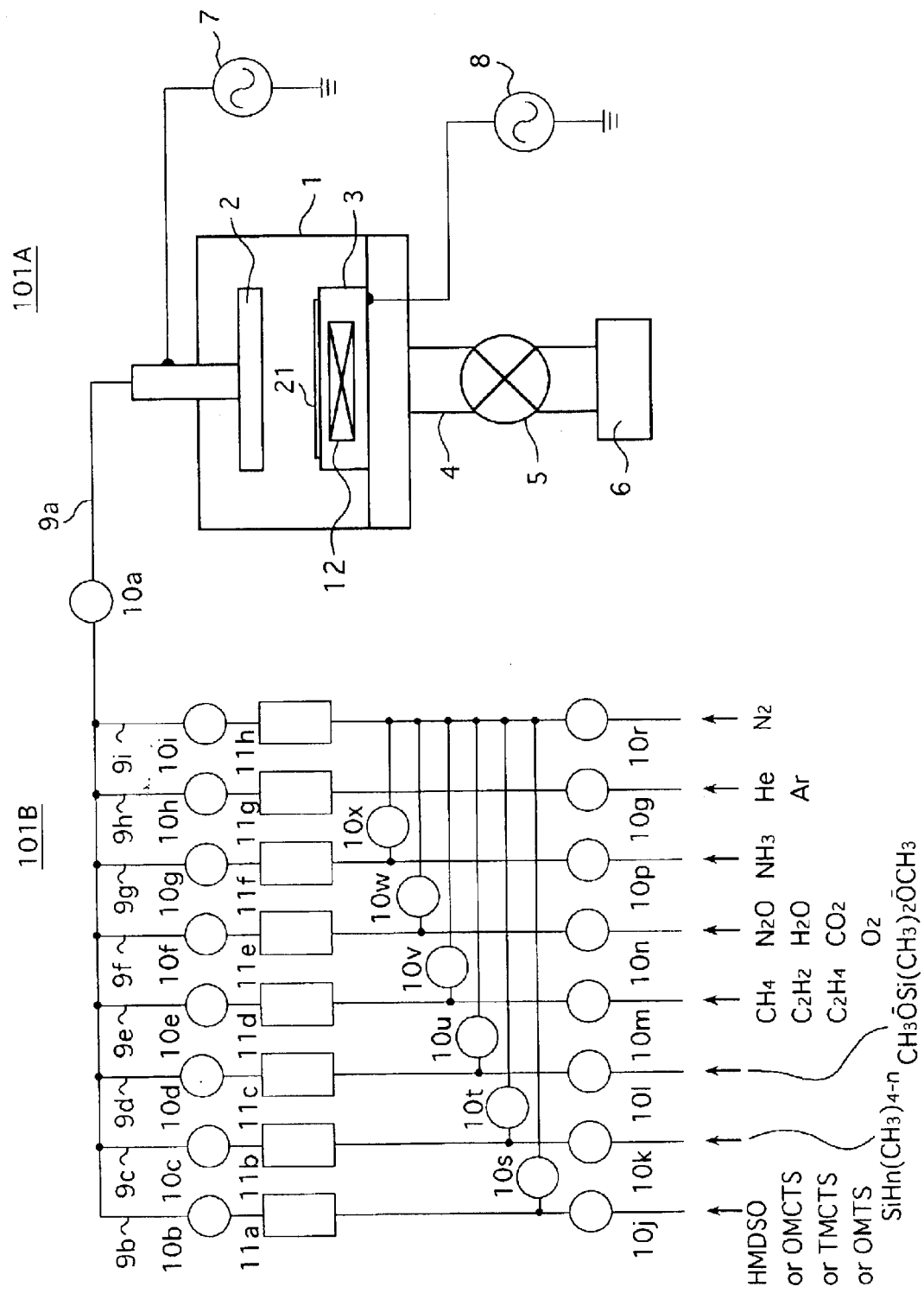
FIG. 1 is a side view of a plasma enhanced CVD apparatus used in an embodiment of a method of manufacturing a semiconductor device, according to the present invention.

FIG. 1 is a side view illustrating a parallel plate plasma enhanced CVD apparatus 101 used in a method of manufacturing a semiconductor device according to an embodiment of the present invention.

This parallel plate plasma enhanced CVD apparatus 101 includes a film forming portion 101A where a barrier insulating film is formed on a substrate 21 via film formation with a plasma gas, and a film forming gas supply portion 101B having a plurality of gas supply sources mixed to form the film forming gas.

The film forming portion 101A comprises a chamber 1 in which pressure can be reduced, as shown in FIG. 1, and the chamber 1 is connected to an exhaust device 6 through an exhaust pipe 4. An open/close valve 5 for controlling communication between the chamber 1 and the exhaust device 6 is provided in the exhaust pipe 4. Pressure measurement means such as a vacuum gauge (not shown) is provided for monitoring pressure in the chamber 1.

A pair of upper and lower electrodes (first and second electrodes) 2 and 3, are provided opposing each other in the chamber 1. A high frequency electric power supply source (RF electric power supply source) 7 for supplying high frequency electric power at a frequency of 13.56 MHz is connected to the upper electrode 2. A low frequency electric power supply source 8 for supplying low frequency electric power at a frequency of 380 kHz is connected to the lower electrode 3. The high frequency electric power is supplied to the upper electrode 2 from at least the high frequency electric power supply source 7, and the film forming gas is converted to a plasma. The upper electrode 2, the lower electrode 3 and the power sources 7 and 8 constitute plasma generation means for converting the film forming gas into a plasma.

Note that not only the low frequency electric power of 380 kHz but also low frequency electric power of a frequency ranging from 50 kHz to 1 MHz can be applied to the lower electrode 3. Moreover, not only the high frequency electric power of 13.56 MHz but also high frequency electric power of a frequency of 1 MHz or more can be applied to the upper electrode 2 facing the lower electrode 3. In FIG. 1, a high frequency power source is connected to the upper electrode 2, and a low frequency electric power source is connected to the lower electrode 3. However, the object of the present invention can also be achieved by connecting the high frequency electric power source 7 to either one of the upper and lower electrodes 2 and 3, with the lower frequency electric power source 8 connected to the other electrode.

The upper electrode 2 serves also as a dispersion head for the film forming gas. Thus, a plurality of through holes for dispersing the film forming gas are formed in the upper electrode 2. Each through hole opens at the surface of upper electrode 2 which faces the lower electrode 3 and the opening portion serves as a discharge port for the film forming gas. This dispersion head (upper electrode 2) is connected to the film forming gas supply portion 101B by a pipe 9a. A heater (not shown) may be provided in some cases in the upper electrode 2. The heater is provided so that particles formed of reaction product of the film forming gas are prevented from adhering to the upper electrode 2 by heating the upper electrode 2 to about 100° C. during film formation.

The lower electrode 3 serves also as a stage for holding the substrate 21. Moreover, the lower electrode 3 comprises a heater 12 for heating the substrate 21 on the holding stage.

The film forming gas supply portion 101B, includes a supply source for an alkyl compound having a siloxane bond such as hexamethyl disiloxane (HMDSO:$(CH_3)_3Si$—O—Si$(CH_3)_3$) or the like, a supply source for methyl silane represented by the formula: $SiH_n(CH_3)_{4-n}$ (n=0 to 3), a supply source for an alkyl compound having an O—Si—O bond, a supply source for a hydrocarbon ($C_mH_n$) such as methane ($CH_4$), acetylene ($C_2H_2$) or ethylene ($C_2H_4$), a supply source for an oxygen-containing gas such as oxygen ($O_2$), dinitrogen monoxide ($N_2O$), water ($H_2O$), or carbon dioxide ($CO_2$), a supply source for ammonia ($NH_3$), a supply source for a dilution gas, i.e., at least one of He and Ar (inert gas), and a supply source for nitrogen ($N_2$) that is also an inert gas.

These gases are suitably supplied to the chamber 1 in the film forming portion 101A through branch pipes 9b to 9i and the pipe 9a connected to the branch pipes 9b to 9i. In the respective branch pipes 9b to 9i, there are provided flow rate adjusting means 11a to 11h and open/close means 10b to 10n and 10p to 10r for controlling communication of the branch pipes 9b to 9i. Open/close means 10a for opening/closing the pipe 9a is provided in the pipe 9a. Moreover, close/open means 10s to 10x for controlling communication between the branch pipe 9i connected to the supply source of a $N_2$ gas and the other branch pipes 9b and 9g are provided in order to purge residual gas from the branch pipes 9b to 9g by allowing the $N_2$ gas to flow therethrough. Note that the $N_2$ gas is also used for purging residual gas from the pipe 9a and the chamber 1 as well as from the branch pipes 9b to 9g. Moreover, the $N_2$ gas is in some cases used as a film forming gas.

Plasma generating means 2, 3, 7 and 8 are provided for converting the film forming gas into a plasma.

Thus, using the above-described apparatus, it is possible to form a barrier insulating film with a low dielectric constant and high denseness, which is capable of suppressing copper diffusion, by use of a plasma enhanced CVD method described below.

Figure 19:
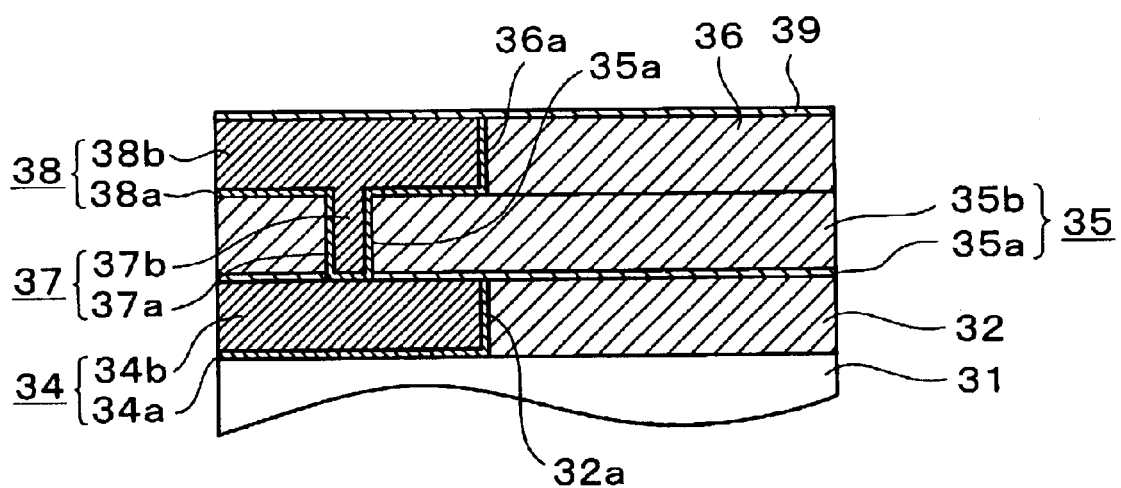
FIG. 19 is a sectional view of a semiconductor device in which the present invention is applied to produce a barrier insulating film covering a wiring made mainly of copper.

FIG. 19 is a sectional view of a semiconductor device including a barrier insulating film, produced by the film forming method of the present invention, covering a wiring made mainly of copper. In FIG. 19, films denoted by symbols 35a, 39 are the barrier insulating films respectively covering lower wiring and upper wiring made mainly of copper.

The semiconductor device is a laminate of a lower wiring insulating film 32, an inter wiring layer insulating film 35 and an upper wiring barrier insulating film 36 on the substrate 31. The wiring insulating films 32, 36 both are formed of a low dielectric insulating film, and the inter wiring layer insulating film 35 is a two-layered structure including the barrier insulating film and a low dielectric insulating film.

The lower wiring 34 is buried in a wiring trench 32a of the insulating film 32, and the upper wiring 38 is buried in a wiring trench 36a of the insulating film 36. The lower wiring 34 and the upper wiring 38 are connected with each other by a conductor 37 buried in a via hole 35a formed through the inter wiring layer insulating film 35. The lower wiring 34, the connection conductor 37 and the upper wiring 38 are formed of mainly copper films 34b, 37b, 38b, and barrier metal films 34a, 37a, 38a protect lower parts and side portions of main copper films 34b, 37b, 38b. The barrier insulating films 35a, 39 cover the upper surfaces of the copper films 34b, 38b, respectively.

Next, an alkyl compound having a siloxane bond, methyl silane, an alkyl compound having an O—Si—O bond, and hydrocarbon, which are the film forming gases used in the present invention will be described.

The following are representative:

(i) alkyl compounds having a siloxane bond:

hexamethyldisiloxane (HMDSO: $(CH_3)_3Si$—O—Si$(CH_3)_3$)

octamethylcyclotetrasiloxane (OMCTS)

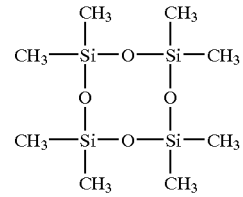

tetramethylcyclotetrasiloxane (TMCTS)

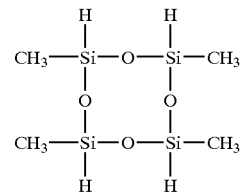

octamethyltrisiloxane (OMTS)

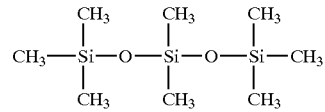

(ii) methyl silanes ($SiH_n(CH_3)_{4-n}$: n=0 to 3)
monomethylsilane ($SiH_3(CH_3)$)
dimethylsilane ($SiH_2(CH_3)_2$)
trimethylsilane ($SiH(CH_3)_3$)
tetramethylsilane ($Si(CH_3)_4$)

(iii) alkyl compounds having an O—Si—O bond
compound having a structural formula of $CH_3$—O—Si$(CH_3)_2$—O—$CH_3$ (iv) hydrocarbons ($C_mH_n$)
methane ($CH_4$)
acetylene ($C_2H_2$)
ethylene ($C_2H_4$)

Film Forming Method

Next; an embodiment of a film forming method using a particularly effective combination of gases and an effective combination of film forming conditions will be described with reference to FIGS. 2A to 2K, which are charts illustrating timing of introduction of each gas component of the film forming gas into the chamber 1, gas flow rate and gas pressure, using high frequency power and, optionally, low frequency power applied to two parallel plate electrodes during the film formation.

FIGS. 2A to 2E illustrate a method of forming a silicon-containing insulating film using a film forming gas composed of at least an alkyl compound and an oxygen-containing gas.

Figure 2A:
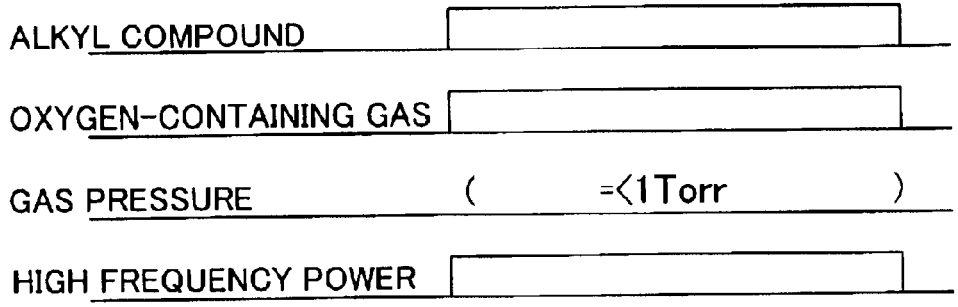
Figure 2B:
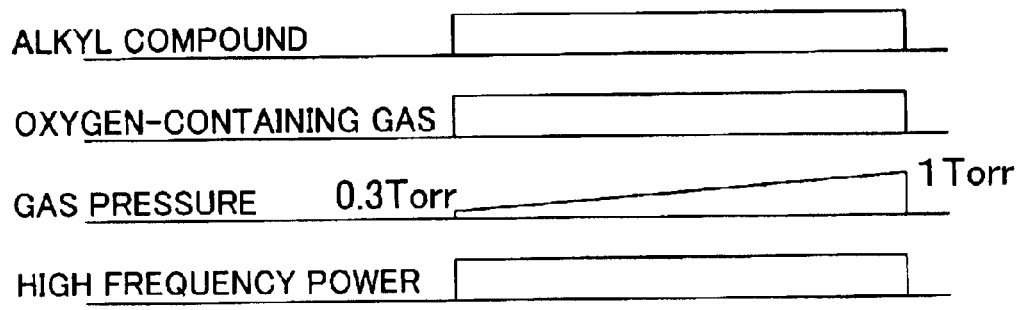
Figure 2C:
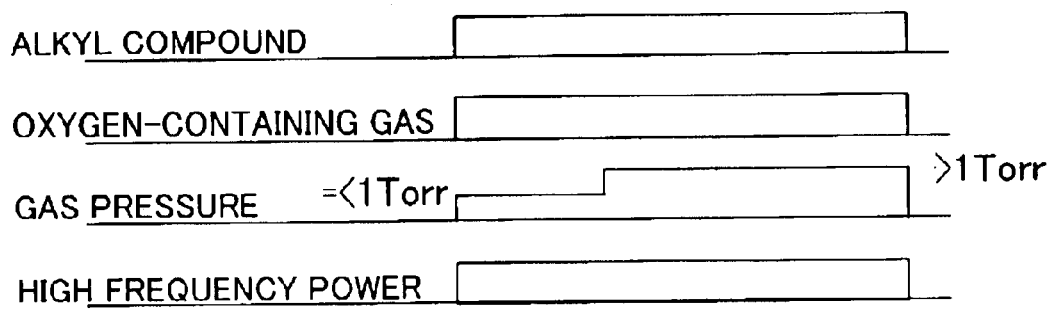

In FIG. 2A, the pressure of the film forming gas introduced into the chamber 1 is regulated to 1 Torr or less, and high frequency power is applied to one of the lower and upper electrodes 2 and 3, thus converting the film forming gas into a plasma state. The chart of FIG. 2B differs from that of FIG. 2A in that the film formation is carried out while gradually increasing the pressure of the film forming gas from low pressure to 1 Torr. The chart of FIG. 2C differs from that of FIG. 2A in that the pressure of the film forming gas introduced into the chamber I is regulated to 1 Torr or less for a certain period of time at an early stage of film formation, and then regulated to a pressure higher than 1 Torr after passage of that certain period of time. The chart of FIG. 2D differs from that of FIG. 2A in that high frequency power is applied to either of the upper and lower electrodes 2 and 3 and low frequency power is applied to the other electrode for a certain period of time at the early stage of the film formation. The chart of FIG. 2E differs from that of FIG. 2A in that the flow rate of the oxygen-containing gas of the film forming gas is higher for a certain period of time at an early stage of the film formation and is lowered after lapse of the certain period of time.

Moreover, in FIGS. 2F to 2K described below, only conditions under which each of the gases is added to other gases are illustrated.

FIGS. 2F to 2H are charts illustrating film formation using a film forming gas containing a dilution gas.

In FIG. 2F, the dilution gas is added at an ordinary flow rate. The chart of FIG. 2G differs from that of FIG. 2F in that the flow rate of the dilution gas is increased. The chart of FIG. 2H differs from that of FIG. 2F in that the flow rate of the dilution gas is increased for a certain period of time at the early stage of the film formation and, then, is lowered after passage of that certain period of time.

FIGS. 2I to 2J are charts of film formation carried out by use of a film forming gas containing at least one of ammonia gas and nitrogen.

In the chart of FIG. 2I, at least one of the ammonia gas and the nitrogen is added through the entire period of the film formation. The chart of FIG. 2J differs from that of FIG. 2I in that at least one of the ammonia gas and the nitrogen is supplied only for a certain period of time at the early stage of the film formation.

The possible combinations of the gases illustrated in FIGS. 2F to 2K and other gases include: (a) The gas of FIGS. 2B, 2D or 2E and any one of gases of FIGS. 2F to 2K; (b) The gas of FIGS. 2B, 2D or 2E, one of the gases of FIGS. 2F to 2H and any one of gases of FIGS. 2I to 2J; and (c) each gas combination of (b) further combined with the gas of FIG. 2K.

Converting the film forming gas into a plasma state using only the high frequency power results in a low relative dielectric constant. Furthermore, it is possible to produce an insulating film sufficiently dense to prevent copper diffusion by controlling the pressure of the film forming gas to 1 Torr or less at least in the early stage of the film formation.

By forming the film while gradually increasing the pressure of the film forming gas from low pressure to 1 Torr, the film can be made denser at a portion closer to the wiring or the electrode mainly formed of the copper film, and with a lower dielectric constant in that portion further from the wiring or the electrode.

Moreover, the denseness can be enhanced by adding ammonia ($NH_3$) or nitrogen ($N_2$) to the film forming gas at least in the early stage of the film formation, or by using a film forming gas containing a dilution gas composed of He, or by increasing the flow rate of the dilution gas at least in the early stage of the film formation, or by applying the low frequency power in the early stage of the film formation.

Moreover, by adding hydrocarbon, it is possible to enhance etching resistance of the low dielectric constant film formed on the barrier insulating film. As described above, the plasma enhanced CVD method of the present invention, applied according to the foregoing charts, forms a barrier insulating film which is sufficiently dense to prevent copper diffusion and which has a low relative dielectric constant.

Next, will be described results of examination of the relative dielectric constant and leakage current of the silicon-containing insulating films formed under various film forming conditions by use of the foregoing plasma enhanced CVD apparatus.

(1) First Embodiment

After removal of a surface oxide film from a copper film, a silicon-containing insulating film was formed on the copper film. The silicon-containing insulating film was formed under the following film forming conditions by use of a plasma enhanced CVD method.
(Treatment Prior to Film Formation)
   (i) treatment gas: $NH_3$
   gas flow rate: 500 sccm
   gas pressure: 1 Torr
   (ii) condition for plasma formation
   frequency: 13.56 MHz
   power: 100 W
   time: 10 seconds
   (iii) substrate heating temperature: 375° C.
(Film Forming Condition I)
   (i) film forming gas
   HMDSO flow rate: 50 sccm
   $N_2O$ flow rate: 400 sccm
   He flow rate: 400 sccm
   gas pressure: 1 Torr
   (ii) conditions of plasma formation
   high frequency power (13.56 MHz) PRF: 250 W
   low frequency power (380 KHz) PLF: 0 W
   (iii) substrate heating temperature: 375° C.
   (iv) formed silicon-containing insulating film
   film thickness: 100 nm
   relative dielectric constant: 2.89
(Annealing Condition)
   temperature: 450° C.
   treatment time: 4 hours For measurement of the relative dielectric constant, a mercury probe having an electrode area of 0.0226 $cm^2$ was allowed to touch the surface of the silicon-containing insulating film. Then, a DC bias voltage was applied to the mercury probe along with a small signal voltage of 1 MHz. The relative dielectric constant was obtained by conversion from the measured C-V characteristics.

For measurement of the leakage current and the dielectric breakdown-resistance, the copper film was grounded and a negative voltage was applied to the mercury probe.

Figure 4:
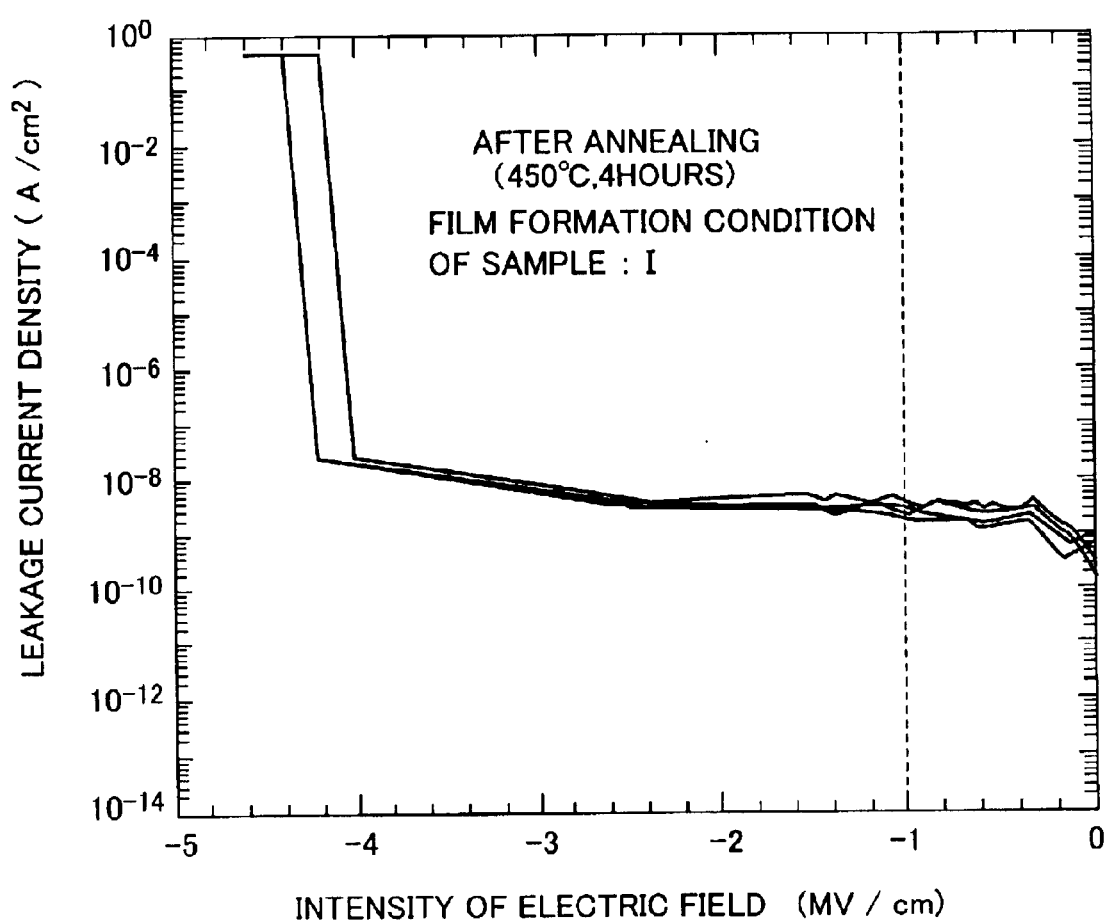
FIG. 4 is a graph of leakage current versus intensity of electric field for a silicon-containing insulating film immediately after the film formation (as depo.) and after annealing, with film formation under the film forming condition I in accordance with the film forming method of the first embodiment of the present invention.

The results obtained by measuring the leakage current and the dielectric breakdown-resistance are shown in FIG. 3 and FIG. 4. FIG. 3 and FIG. 4 are graphs obtained by examining the leakage current and the dielectric breakdown-resistance, the, leakage current flowing between the mercury probe and the copper film which sandwich the silicon-containing insulating film therebetween. FIG. 3 shows the results of examination immediately after forming the silicon-containing insulating film. FIG. 4 shows the results of examination after forming the silicon-containing insulating film and after annealing the silicon-containing insulating film under the foregoing conditions.

The ordinate of FIG. 3 indicates leakage current density ($A/cm^2$) expressed as a logarithmic scale, and the abscissa of FIG. 3 indicates intensity (MV/cm) of electric field expressed as a linear scale, the electric field being applied to the silicon-containing insulating film. Note that the negative sign of the abscissa means that a negative potential is applied to the silicon-containing insulating film. FIG. 4 shows the same aspect as FIG. 3.

As shown in FIG. 3 and FIG. 4, the leakage current is nearly equal to $10^{-10}$ $A/cm^2$ when the intensity of the electric field is −1 MV/cm. Over the entire range of measurement of the electric field intensity, the leakage current hardly changed before and after annealing.

The fact that the leakage current rapidly rises between −4 MV/cm and −5 MV/cm in FIGS. 3 and 4 implies dielectric breakdown in the silicon-containing insulating film due to the electric field. The electric field at which the dielectric breakdown occurs decreases a little after annealing. The electric field intensity at which the dielectric breakdown occurs is equal to −4 MV/cm or more, and this electric filed intensity is close to the substantial dielectric breakdown-resistance of the insulating film itself. This result shows that copper diffusion is suppressed.

In the foregoing description, though HMDSO having a siloxane bond is used as the alkyl compound, other alkyl compounds having a siloxane bond, for example, octamethyl-cyclotetrasiloxane (OMCTS), tetramethyl-cyclotetrasiloxane (TMCTS) or octamethyl-trisiloxane (OMTS) can be used. Further, methylsilane ($SiH_n(CH_3)_{4-n}$: n=0 to 3) or an alkyl compound having an O—Si—O bond can be used.

(2) Second Embodiment

After removal of a surface oxide film from a copper film, similar to the first embodiment, a silicon-containing insulating film was formed on the copper film. The silicon-containing insulating film was formed under the following film forming conditions by use of a plasma enhanced CVD method. Note that treatment conditions prior to the film formation and annealing conditions are the same as those of the first embodiment.

(Film Forming Condition II)
   (i) film forming gas
   HMDSO flow rate: 50 sccm
   $N_2O$ flow rate: 400 sccm
   He flow rate: 400 sccm
   gas pressure: 0.5 Torr
   (ii) condition for plasma formation
   high frequency power (13.56 MHz) PRF: 250 W
   low frequency power (380 KHz) PLF: 0 W
   (iii) substrate heating temperature: 375° C.
   (iv) formed silicon-containing insulating film
   film thickness: 100 nm
   relative dielectric constant: 3.47

Measurements of the relative dielectric constant and the leakage current were conducted in the same manner as the first embodiment, which measurements found the relative dielectric constant to be 3.47 as described above.

Figure 5:
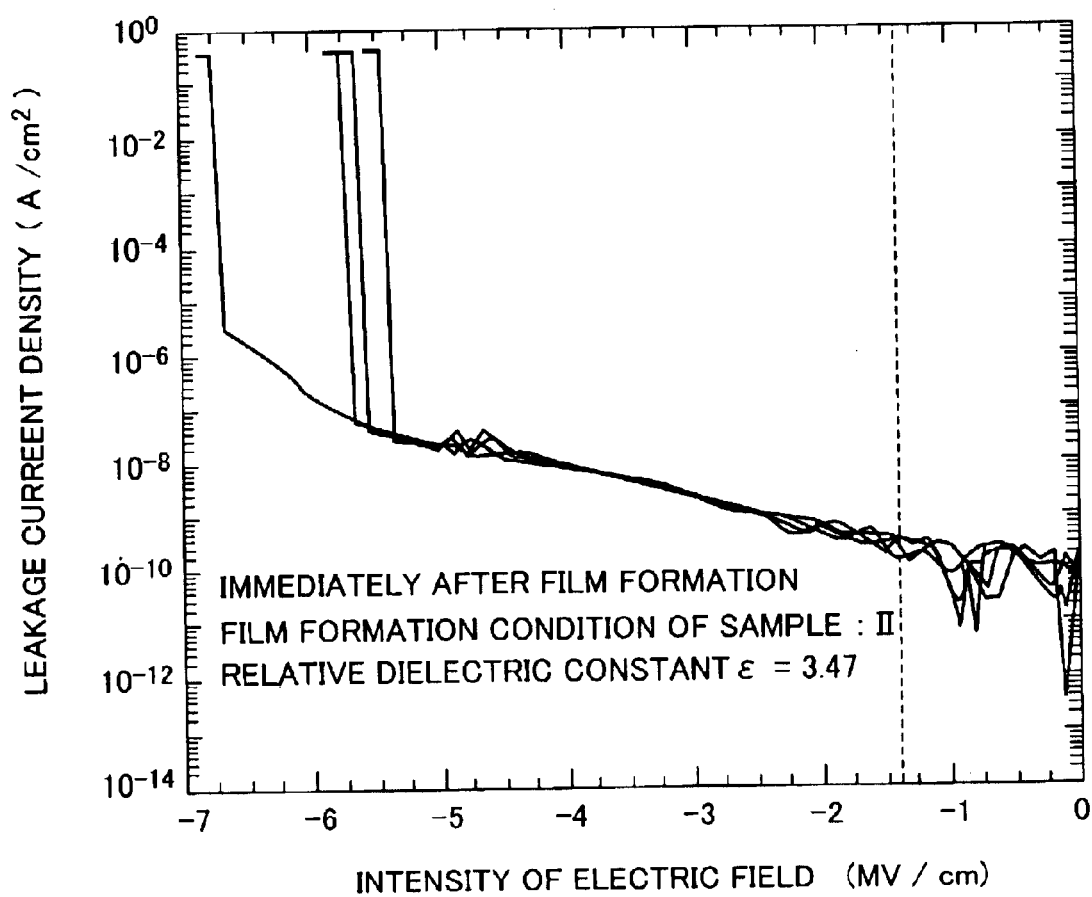
FIG. 5 is a graph of leakage current versus intensity of electric field for a silicon-containing insulating film immediately after film formation under condition II according to a second embodiment of the present invention.
Figure 6:
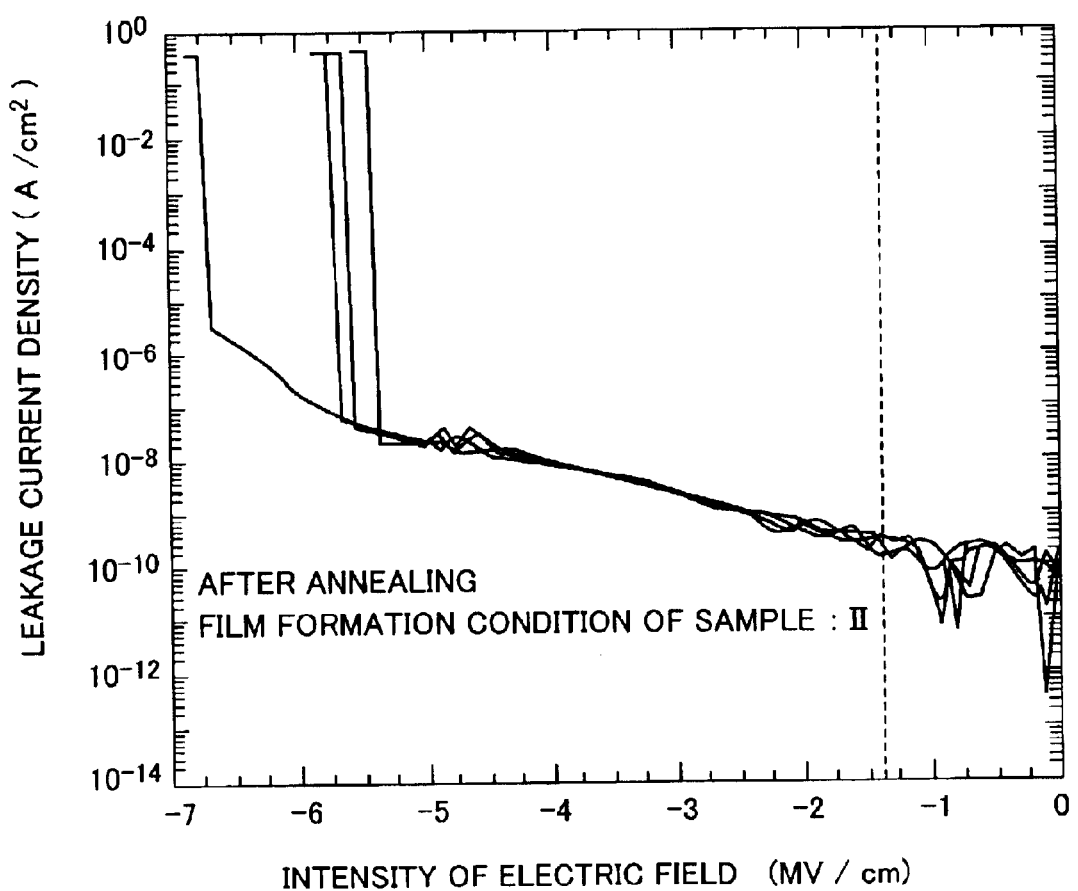
FIG. 6 is a graph of leakage current versus intensity of electric field for the silicon-containing insulating film immediately after film formation and after annealing, which film is formed under film forming condition II according to the second embodiment of the present invention.

The results obtained for the leakage current are shown in FIG. 5 and FIG. 6. FIG. 5 and FIG. 6 are graphs obtained by examining the leakage current flowing between the mercury probe and the copper film which sandwich the silicon-containing insulating film therebetween. FIG. 5 illustrates the results of examination immediately after forming the silicon-containing insulating film. FIG. 6 illustrates the results obtained by examination after forming and after annealing the silicon-containing insulating film.

The ordinate of FIG. 5 indicates leakage current density ($A/cm^2$) expressed as a logarithmic scale, and the abscissa of FIG. 5 indicates intensity (MV/cm) of electric field expressed as a linear scale, the electric field being applied to the silicon-containing insulating film. FIG. 6 illustrates the same aspect as FIG. 5.

As illustrated in FIG. 5 and FIG. 6, the leakage current is equal to $10^{-9}$ $A/cm^2$ or less when the intensity of the electric field is −1 MV/cm, immediately after the film formation. Over the entire range of measurement of the electric field intensity, the leakage current hardly changed before and after the performance of annealing.

The intensity of the electric field at which the dielectric breakdown of the silicon-containing insulating film occurs ranges between −4 MV/cm and −5 MV/cm, and this fact implies that the copper diffusion is suppressed, similar to the first embodiment.

(3) Third Embodiment

After a surface oxide film was removed from a copper film, similar to the first embodiment, a silicon-containing insulating film was formed on the copper film. The silicon-containing insulating film was formed under the following film forming conditions by use of a plasma enhanced CVD method.

(Film Forming Condition III)
   (i) film forming gas
   HMDSO flow rate: 50 sccm
   $N_2O$ flow rate: 400 sccm
   He flow rate: 400 sccm
   $NH_3$ gas flow rate: 200 sccm
   gas pressure: 1.0 Torr
   (ii) condition for plasma formation
   high frequency power (13.56 MHz) PRF: 250 W
   low frequency power (380 KHz) PLF: 0 W
   (iii) substrate heating temperature: 375° C.
   (iv) formed silicon-containing insulating film
   film thickness: 100 nm
   relative dielectric constant: 3.7

Measurements of the relative dielectric constant and the leakage current were conducted in the same manner as in the first embodiment.

According to the results of measurement, the relative dielectric constant was 3.7, as described above.

Figure 7:
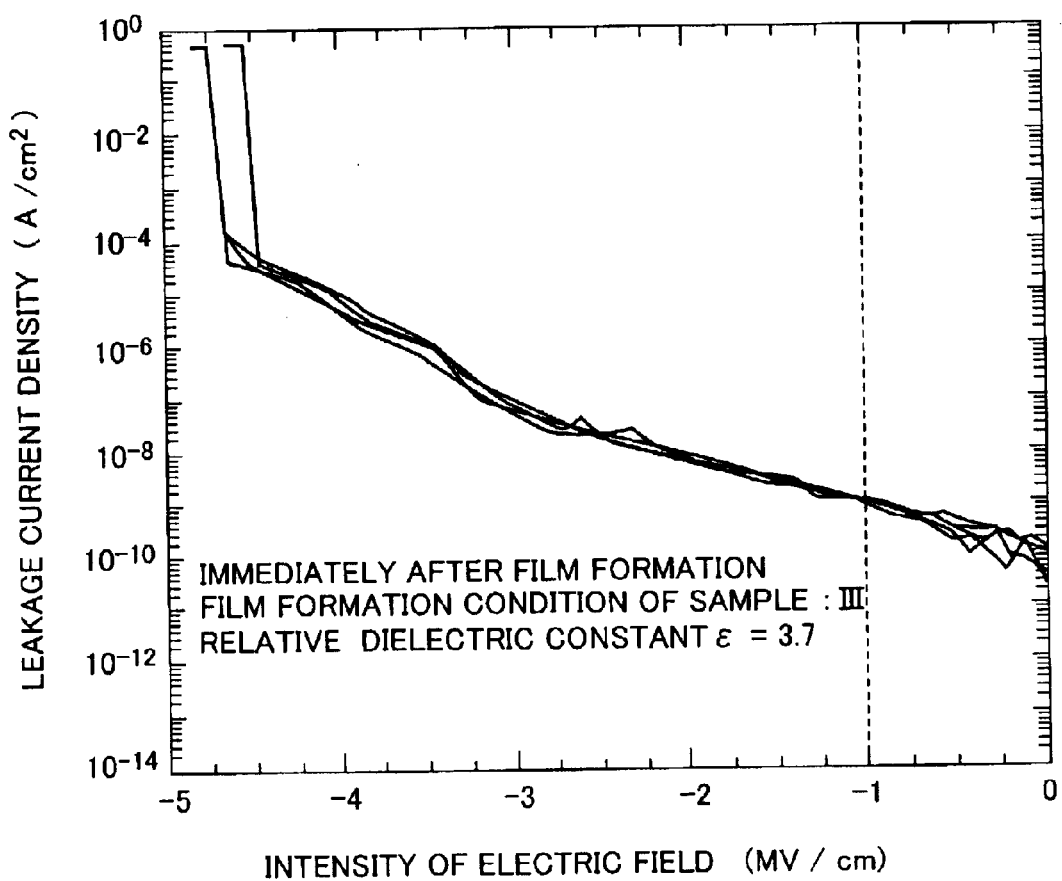
FIG. 7 is a graph of leakage current versus intensity of electric field for a silicon-containing insulating film immediately after film formation under condition III according to a third embodiment of the present invention.
Figure 8:
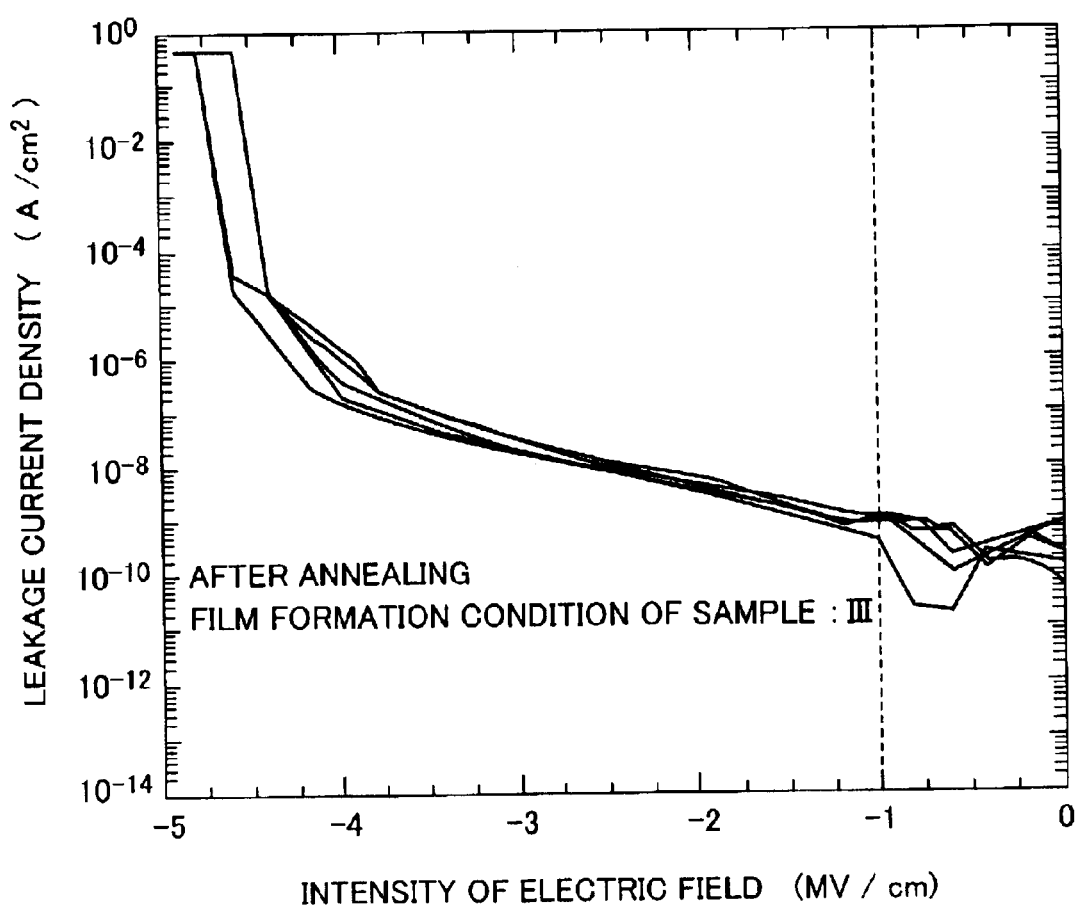
FIG. 8 is a graph of leakage current versus intensity of electric field for the silicon-containing insulating film immediately after the film formation (as depo.) and after annealing, which film is formed under condition III according to the third embodiment of the present invention.

The results obtained by measuring the leakage current are shown in FIG. 7 and FIG. 8. FIG. 7 and FIG. 8 are graphs obtained by examining the leakage current flowing between the mercury probe and the copper film which sandwich the silicon-containing insulating film therebetween. FIG. 7 illustrates the results obtained by examination immediately after forming the silicon-containing insulating film. FIG. 8 illustrates the results obtained by examination after forming and after annealing the silicon-containing insulating film.

The ordinate of FIG. 7 indicates a leakage current density (A/cm$^2$) expressed as a logarithmic scale, and the abscissa of FIG. 7 indicates an intensity (MV/cm) of electric field expressed as a linear scale, the electric field being applied to the silicon-containing insulating film. FIG. 8 illustrates the same aspect as FIG. 7.

As illustrated in FIG. 7 and FIG. 8, the leakage current is equal to $10^{-9}$ A/cm$^2$ when the intensity of the electric field is $-1$ MV/cm, immediately after the film formation. After annealing, the leakage current hardly changes its value from that before annealing, except that it decreased slightly around $-4$ MV/cm of the electric field intensity.

The intensity of the electric field at which the dielectric breakdown of the silicon-containing insulating film occurs also ranged between $-4$ MV/cm and $-5$ MV/cm, and this fact implies that the copper diffusion is suppressed in a manner similar to the first and second embodiments.

(4) Fourth Embodiment

A fourth embodiment of the present invention will be described with reference to FIG. 9 and FIG. 10.

Figure 9:
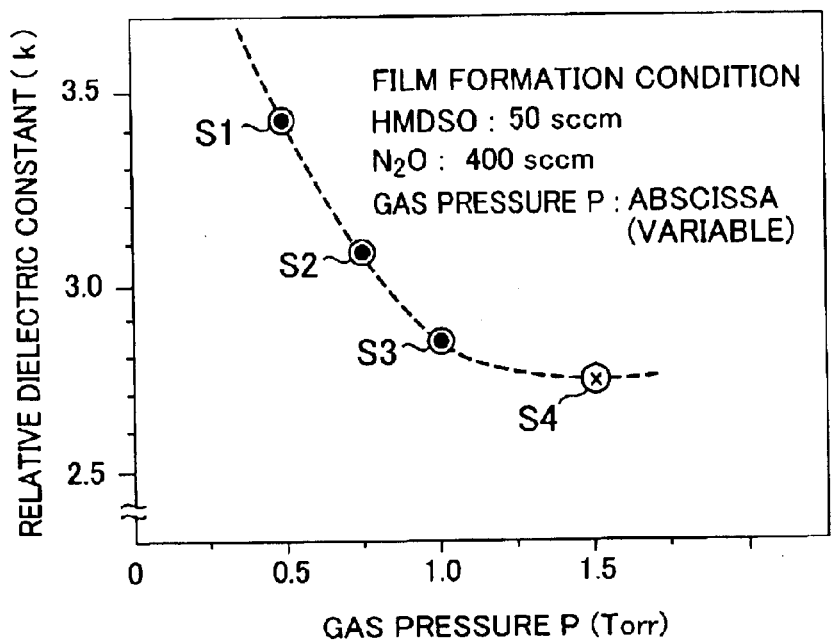
FIG. 9 is a graph of relative dielectric constant (k) versus gas pressure (P) of the film forming gas, and the relationship with dielectric breakdown-resistance of the insulating film after annealing with the gas pressure (P) and the relative dielectric constant (k), for an insulating film prepared under film forming condition IV in accordance with a fourth embodiment of the present invention.

FIG. 9 is a graph of change in relative dielectric constant (k) of an insulating film relative to a gas pressure (P) of a film forming gas and shows the relationship between dielectric breakdown-resistance of the insulating film after annealing and the gas pressure (P) and the relative dielectric constant (k). FIG. 10 is a graph illustrating barrier capability of the insulating film which is prepared under film forming condition IV.

First, the conditions for preparation of the samples S1 to S4 used for this investigation will be described. The treatment conditions prior to the film formation and the annealing conditions after the film formation are the same as those of the first embodiment. The film forming conditions were as follows.

(Film Forming Conditions IV)
 (i) film forming gas
  HMDSO flow rate: 50 sccm
  N$_2$O flow rate: 400 sccm
  gas pressure: parameters (0.5, 0.75, 1.0 and 1.5 Torr, corresponding respectively to the samples S1 to S4)
 (ii) condition for plasma formation
  high frequency power (13.56 MHz) PRF: 250 W
  low frequency power (380 KHz) PLF: 0 W
 (iii) substrate heating temperature: 375° C.
 (iv) formed silicon-containing insulating film
  film thickness: 100 nm
  relative dielectric constant: see FIG. 9

Measurement of the relative dielectric constant was conducted before annealing in the same manner as in the first embodiment. Measurement of the dielectric breakdown-resistance was conducted in the same manner as measurement of the leakage current in the first embodiment. Examination of the copper barrier property of the formed insulating film was conducted by SIMS (Secondary Ion Mass Spectroscopy).

In FIG. 9, the ordinate indicates the relative dielectric constant (k) expressed as a linear scale, and the abscissa indicates the gas pressure (P) (Torr) of the film forming gas, which is expressed as a linear scale. Moreover, the measurement points are indicated by the symbol ○. In this case, the symbol ● in the symbol ○ indicates that none of the five samples was broken during the dielectric breakdown-resistance test after annealing. The symbol X in the symbol ○ indicates that all of the five samples were broken. The symbol Δ indicates that one or two of the five samples were broken. A sample in which current flows through the insulating film from the early stage of voltage application was judged to be broken, and a sample in which the dielectric breakdown voltage decreased after annealing, but the insulating film showed breakdown voltage to some degree, was judged to be sound. These criteria were also applied for the fifth to tenth embodiments to be described below.

According to the results shown in FIG. 9, as the gas pressure (P) increases, the relative dielectric constant (k) decreases. When the gas pressure (P) was equal to 1.0 Torr or less, the insulating film showed dielectric breakdown-resistance, and did not show dielectric breakdown-resistance when the gas pressure (P) was 1.5 Torr.

Figure 10:
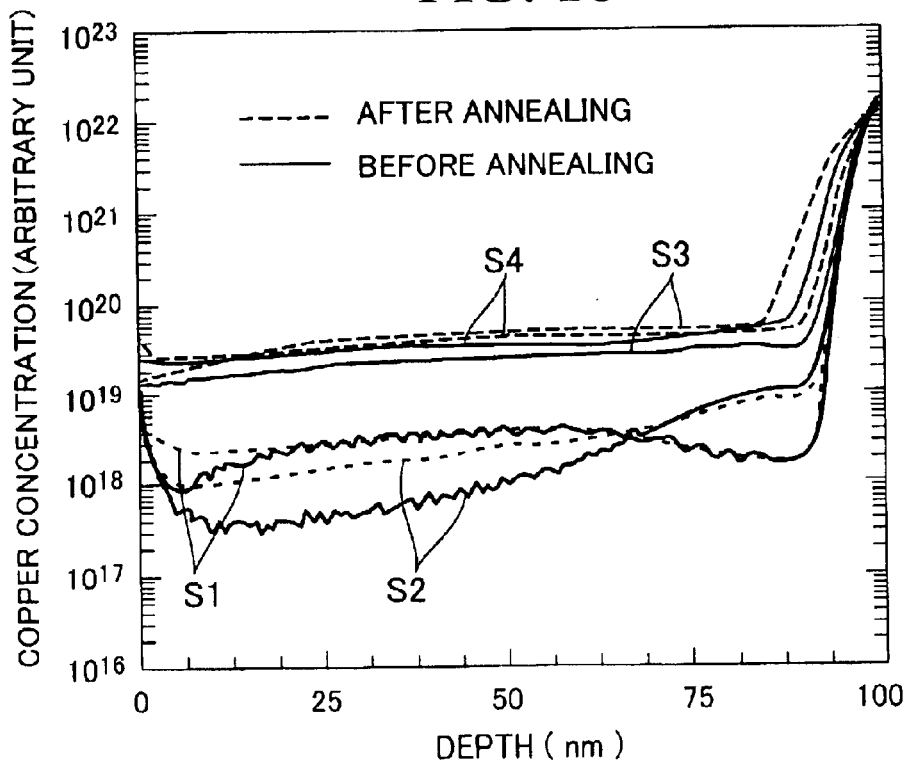
FIG. 10 is a graph illustrating barrier resistance to copper in the insulating film prepared under the condition IV in accordance with the fourth embodiment of the present invention.

FIG. 10 is a graph illustrating results of investigation of the copper barrier property of the formed insulating film. The results of FIG. 10 were obtained by investigating the copper distribution in the insulating film before and after annealing by use of SIMS.

In FIG. 10, the ordinate indicates copper concentration (arbitrary unit) in the insulating film, which is expressed on a logarithmic scale, and the abscissa indicates measurement spot depth (nm) from the surface of the insulating film, expressed on a linear scale.

According to the results shown in FIG. 10, all of the samples S1 to S4 contained copper in the insulating film from the time when the samples S1 to S4 were subjected to annealing, and this is believed to be due to the insulating film becoming adulterated with copper during the film formation. Accordingly, it is inevitable that the change in the content of the copper in the insulating film before and after annealing would be observed in FIG. 10.

None of the samples S3 broke in the dielectric breakdown-resistance test, but the samples S3 showed copper diffusion into the insulating film. On the other hand, in the samples S1 and S2, copper diffusion was hardly observed, even after annealing. Specifically, this implies that the samples S1 and S2 possess the desired barrier property.

(5) Fifth Embodiment

A fifth embodiment of the present invention will be described with reference to FIG. 11.

Figure 11:
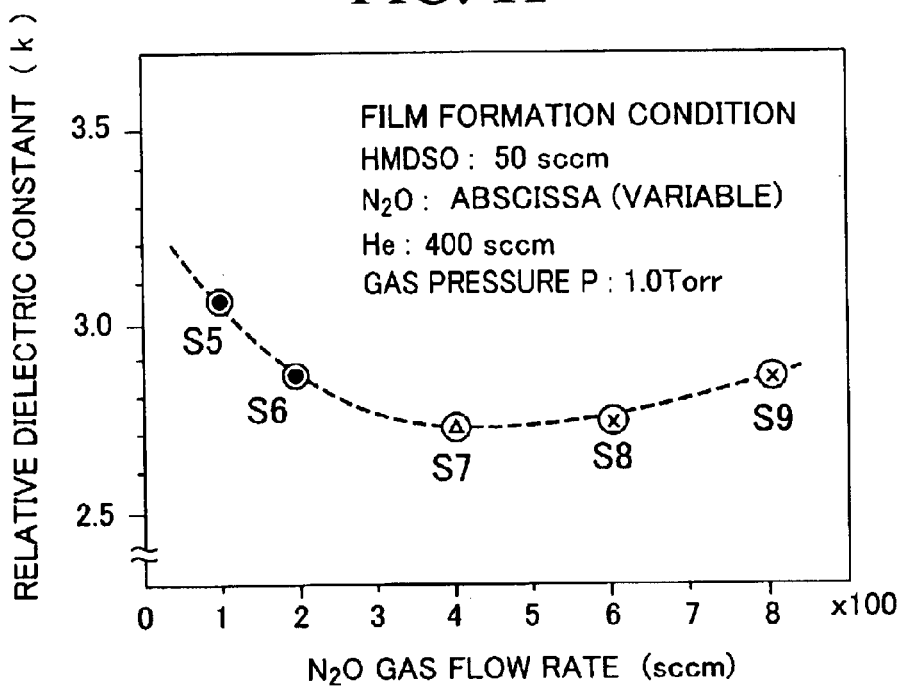
FIG. 11 is a graph illustrating change in relative dielectric constant (k) of an insulating film relative to a $N_2O$ gas flow rate in the film forming gas, and the relationship between dielectric breakdown-resistance after annealing and $N_2O$ gas flow rate and the relative dielectric constant (k), for an insulating film which is prepared under film forming condition V in accordance with a fifth embodiment of the present invention.

FIG. 11 is a graph illustrating change in relative dielectric constant (k) of an insulating film relative to N$_2$O gas flow rate in a film forming gas and shows the relationship of dielectric breakdown-resistance of the insulating film after annealing with the N$_2$O gas flow rate and the relative dielectric constant (k).

First, preparation of the samples S5 to S9 will be described. Treatment conditions prior to the film formation and annealing conditions were the same as those of the first embodiment. The film forming conditions were as follows.

(Film Forming Condition V)
 (i) film forming gas
  HMDSO flow rate: 50 sccm
  N$_2$O flow rate: parameters (100, 200, 400, 600 and 800 sccm, corresponding respectively to the samples S5 to S9)
  He flow rate: 400 sccm
  gas pressure (P): 1 Torr
 (ii) condition for plasma formation
  high frequency power (13.56 MHz) PRF: 250 W
  low frequency power (380 KHz) PLF: 0 W
 (iii) substrate heating temperature: 375° C.

(iv) formed silicon-containing insulating film film thickness: 100 nm relative dielectric constant: see FIG. 11

Measurement of the relative dielectric constant was conducted before annealing in the same manner as in the first embodiment. Measurement of the dielectric breakdown-resistance was conducted in the same manner as measurement of leakage current in the first embodiment.

FIG. 11 is a graph of change in the relative dielectric constant (k) of the insulating film relative to the $N_2O$ gas flow rate (sccm) in the film forming gas and shows the relationship of the dielectric breakdown-resistance of the insulating film after annealing with the $N_2O$ gas flow rate and the relative dielectric constant (k). In FIG. 11, the ordinate indicates a relative dielectric constant (k) expressed on a linear scale, and the abscissa indicates a $N_2O$ gas flow rate (sccm) in the film forming gas expressed on a linear scale.

According to the results shown in FIG. 11, as the $N_2O$ gas flow rate increases, the relative dielectric constant (k) decreases. When the $N_2O$ gas flow rate becomes higher than about 400 sccm, the relative dielectric constant (k) increases as the $N_2O$ gas flow rate becomes higher. The insulating film showed dielectric breakdown-resistance when the $N_2O$ gas flow rate was 400 sccm or less, and did not show dielectric breakdown-resistance when the $N_2O$ gas flow rate was 600 sccm.

(6) Sixth Embodiment

A sixth embodiment of the present invention will be described with reference to FIG. 12.

Figure 12:
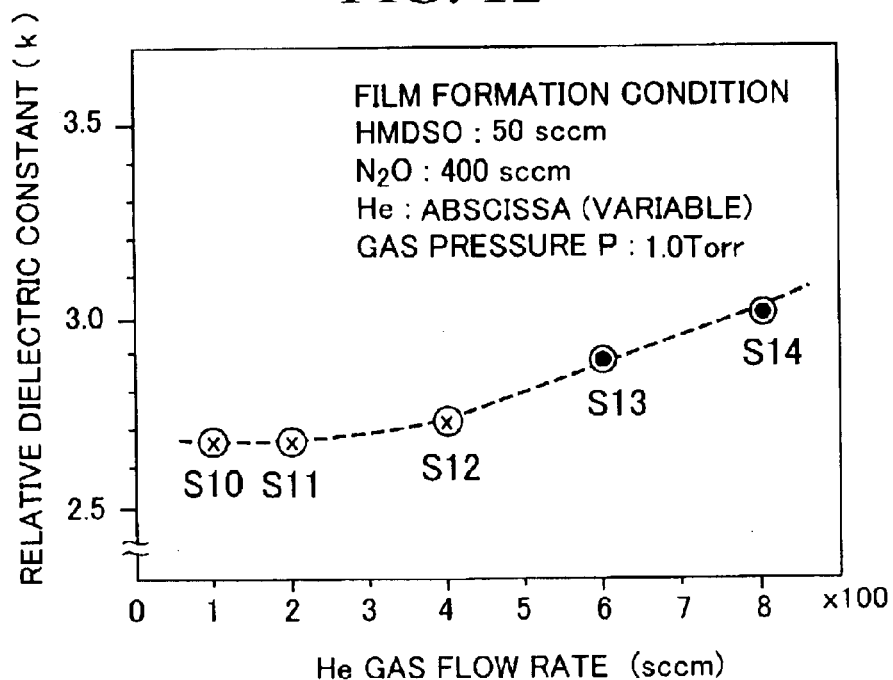
FIG. 12 is a graph illustrating change in relative dielectric constant (k) of an insulating film relative to a He gas flow rate in a film forming gas, and the relationship between dielectric breakdown-resistance after annealing and He gas flow rate and the relative dielectric constant (k), for an insulating film prepared under film forming condition VI in accordance with a sixth embodiment of the present invention.

FIG. 12 is a graph of change in relative dielectric constant (k) of an insulating film relative to He gas flow rate in a film forming gas, and shows the relationship between dielectric breakdown-resistance of the insulating film after annealing, the He gas flow rate, and the relative dielectric constant (k).

First, the preparation of the samples S10 to S14 used for this investigation will be described. The treatment conditions prior to the film formation and the annealing conditions are the same as those of the first embodiment. The film forming conditions are as follows.

(Film Forming Condition VI)

(i) film forming gas

HMDSO flow rate: 50 sccm $N_2O$ flow rate: 400 sccm

He flow rate: parameters (100, 200, 400, 600 and 800 sccm, corresponding respectively to the samples S 10 to S 14)

gas pressure (P): 1 Torr (ii) condition for plasma formation high frequency power (13.56 MHz) PRF: 250 W low frequency power (380 KHz) PLF: 0 W (iii) substrate heating temperature: 375° C.

(iv) formed silicon-containing insulating film film thickness: 100 nm relative dielectric constant: see FIG. 12

Measurement of the relative dielectric constant was conducted before annealing in the same manner as in the first embodiment. Measurement of the dielectric breakdown-resistance was conducted in the same manner as measurement of the leakage current in the first embodiment.

FIG. 12 is a graph of the change of the relative dielectric constant (k) of the insulating film relative to the He gas flow rate in the film forming gas, and shows the relationship of the dielectric breakdown-resistance of the insulating film after annealing with the He gas flow rate and the relative dielectric constant (k).

In FIG. 12, the ordinate indicates the relative dielectric constant (k) expressed on a linear scale, and the abscissa indicates the He gas flow rate (sccm) in the film forming gas, which is also expressed on a linear scale.

According to the results shown in FIG. 12, as the He gas flow rate became higher, the relative dielectric constant (k) gradually increased. When the He gas flow rate was equal to 400 sccm or less, the insulating film did not show dielectric breakdown-resistance, but did show dielectric breakdown-resistance when the He gas flow rate exceeded 400 sccm.

(7) Seventh Embodiment

A seventh embodiment of the present invention will be described with reference to FIG. 13.

Figure 13:
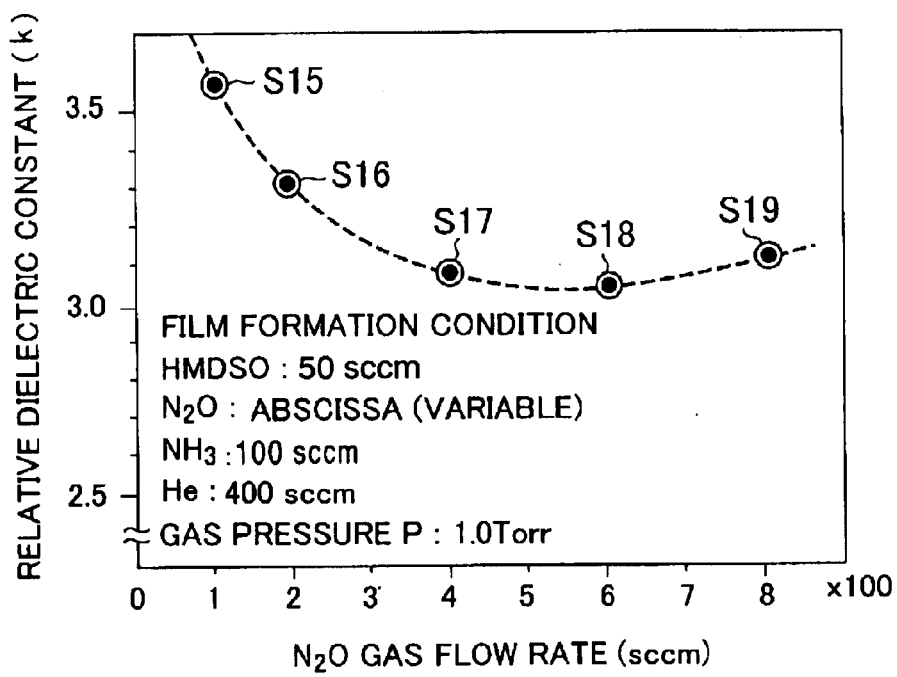
FIG. 13 is a graph illustrating change in relative dielectric constant (k) of an insulating film relative to a $N_2O$ gas flow rate in a film forming gas, and the relationship between dielectric breakdown-resistance after annealing and $N_2O$ gas flow rate and the relative dielectric constant (k), for an insulating film prepared under film forming condition VII in accordance with a seventh embodiment of the present invention.

FIG. 13 is a graph of change in relative dielectric constant (k) of an insulating film relative to $N_2O$ gas flow rate in a film forming gas and shows the relationship of dielectric breakdown-resistance of the insulating film after annealing with the $N_2O$ gas flow rate and the relative dielectric constant (k). The seventh embodiment differs from the fifth embodiment (FIG. 11) in that the film forming gas contained $NH_3$ gas.

First, the preparation of samples S15 to S19 used for this investigation will be described. The treatment conditions prior to the film formation and the annealing conditions were the same as those of the first embodiment. The film forming conditions were as follows.

(Film Forming Condition VII)

(i) film forming gas

HMDSO flow rate: 50 sccm $N_2O$ flow rate: parameters (100, 200, 400, 600 and 800 sccm, corresponding respectively to the samples S15 to S19)

$NH_3$ flow rate: 100 sccm

He flow rate: 400 sccm gas pressure (P): 1 Torr (ii) condition for plasma formation high frequency power (13.56 MHz) PRF: 250 W low frequency power (380 KHz) PLF: 0 W (iii) substrate heating temperature: 375° C.

(iv) formed silicon-containing insulating film film thickness: 100 nm relative dielectric constant: see FIG. 13

Measurement of the relative dielectric constant before annealing was conducted in the same manner as in the first embodiment. Measurement of the dielectric breakdown-resistance was conducted in the same manner as measurement of the leakage current in the first embodiment.

FIG. 13 is a graph of the change of the relative dielectric constant (k) of the insulating film relative to the $N_2O$ gas flow rate in the film forming gas and shows the relationship of the dielectric breakdown-resistance of the insulating film after annealing with the $N_2O$ gas flow rate and the relative dielectric constant (k).

In FIG. 13, the ordinate indicates the relative dielectric constant (k) expressed on a linear scale, and the abscissa indicates the $N_2O$ gas flow rate (sccm) in the film forming gas, which is expressed on a linear scale.

According to the results shown in FIG. 13, as the $N_2O$ gas flow rate becomes higher, the relative dielectric constant (k) decreases. When the $N_2O$ gas flow rate was in a range of 400 to 600 sccm, the relative dielectric constant gradually increased. All of the samples S15 to S19 showed dielectric breakdown-resistance.

(8) Eighth Embodiment

An eighth embodiment of the present invention will be described with reference to FIG. 14.

Figure 14:
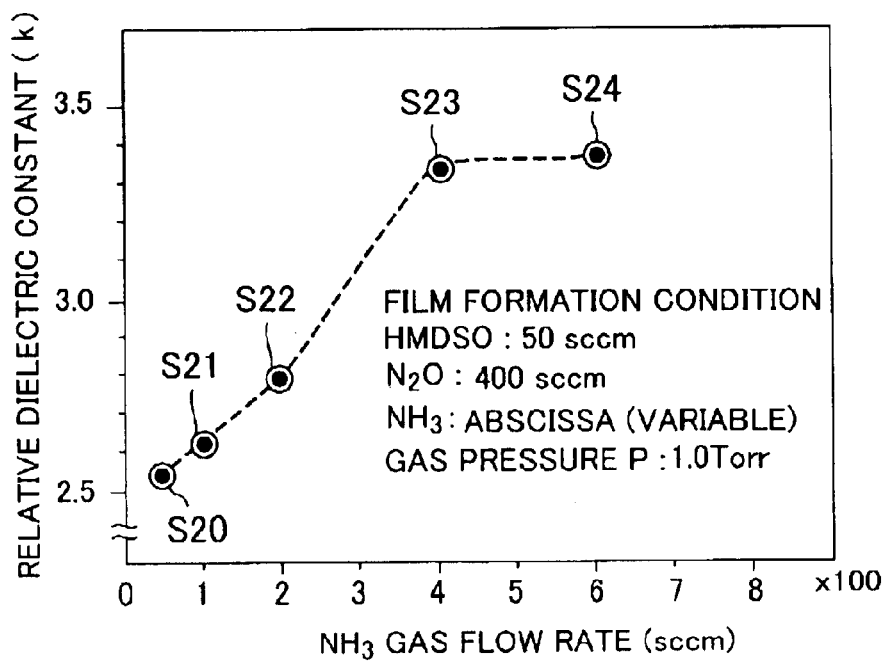
FIG. 14 is a graph illustrating change in relative dielectric constant (k) of an insulating film relative to $NH_3$ gas flow rate, and the relationship between dielectric, breakdown-resistance of the insulating film after annealing and the NH3 gas flow rate and the relative dielectric constant (k), for an insulating film prepared under film forming condition VIII in accordance with an eighth embodiment of the present invention.

FIG. 14 is a graph of change of a relative dielectric constant (k) of an insulating film relative to $NH_3$ gas flow rate in a film forming gas and shows the relationship of dielectric breakdown-resistance of the insulating film after annealing with the $NH_3$ gas flow rate and the relative dielectric constant (k).

First, the preparation of the samples S20 to S24 used for this investigation will be described. The treatment conditions prior to the film formation and the annealing conditions were the same as those of the first embodiment. The film forming conditions were as follows.

(Film Forming Condition VIII)
- (i) film forming gas
  - HMDSO flow rate: 50 sccm
  - $N_2O$ flow rate: 400 sccm
  - $NH_3$ flow rate: parameters (50, 100, 200, 400 and 600 sccm, corresponding respectively to the samples S20 to S24)
  - gas pressure (P): 1 Torr
- (ii) condition for plasma formation
  - high frequency power (13.56 MHz) PRF: 250 W
  - low frequency power (380 KHz) PLF: 0 W
- (iii) substrate heating temperature: 375° C.
- (iv) formed silicon-containing insulating film
  - film thickness: 100 nm
  - relative dielectric constant: see FIG. 14

Measurement of the relative dielectric constant was conducted in the same manner as in the first embodiment before annealing. Measurement of the dielectric breakdown-resistance was conducted in the same manner as measurement of the leakage current in the first embodiment.

FIG. 14 is a graph of the change in the relative dielectric constant (k) of the insulating film relative to $NH_3$ gas flow rate in the film forming gas and shows the relationship between the dielectric breakdown-resistance of the insulating film after annealing and the $NH_3$ gas flow rate and the relative dielectric constant (k).

In FIG. 14, the ordinate indicates the relative dielectric constant (k) expressed on a linear scale, and the abscissa indicates the $NH_3$ gas flow rate (sccm) in the film forming gas, which is also expressed on a linear scale.

According to the results shown in FIG. 14, when the $NH_3$ gas flow rate was 50 sccm, the relative dielectric constant was about 3. Then, as the $NH_3$ gas flow rate increased, the relative dielectric constant (k) rapidly increased, and the relative dielectric constant (k) stabilized at an almost constant value (about 5) in case of 400 sccm or more of the $NH_3$ gas flow rate. All of the samples S20 to S24 showed dielectric breakdown-resistance.

(9) Ninth Embodiment

The foregoing fourth to eighth embodiments proved that the dielectric breakdown-resistance became larger with increase in the relative dielectric constant. Therefore, it is difficult for the single layer insulating films according to the fourth to eighth embodiments to meet the demand for a low relative dielectric constant and a high dielectric breakdown-resistance. In order to simultaneously meet these demands, the insulating film should be composed of at least two layers, including an insulating film showing an excellent dielectric breakdown-resistance in spite of a high relative dielectric constant and an insulating film showing a low relative dielectric breakdown-resistance in spite of a low relative dielectric constant, stacked together. In this case, particularly in order to satisfactorily meet demand for low relative dielectric constant and high dielectric breakdown-resistance, it is preferable that the insulating film showing excellent dielectric breakdown-resistance be made thin and the insulating film showing low relative dielectric constant be made thick.

The ninth embodiment of the present invention conducted to comply with these demands will be described with reference to FIGS. 15 to 18.

The ninth embodiment differs from the fourth to eighth embodiments in that an insulating film composed of an underlying film (symbol □) covering copper and a main insulating film (symbol ○) is formed on the underlying film. The thickness of the underlying film was 10 nm, and the thickness of the main insulating film was 90 nm. In this embodiment, the overall dielectric breakdown-resistance of the entire two-layered structure formed of the two insulating films was investigated.

Figure 15:
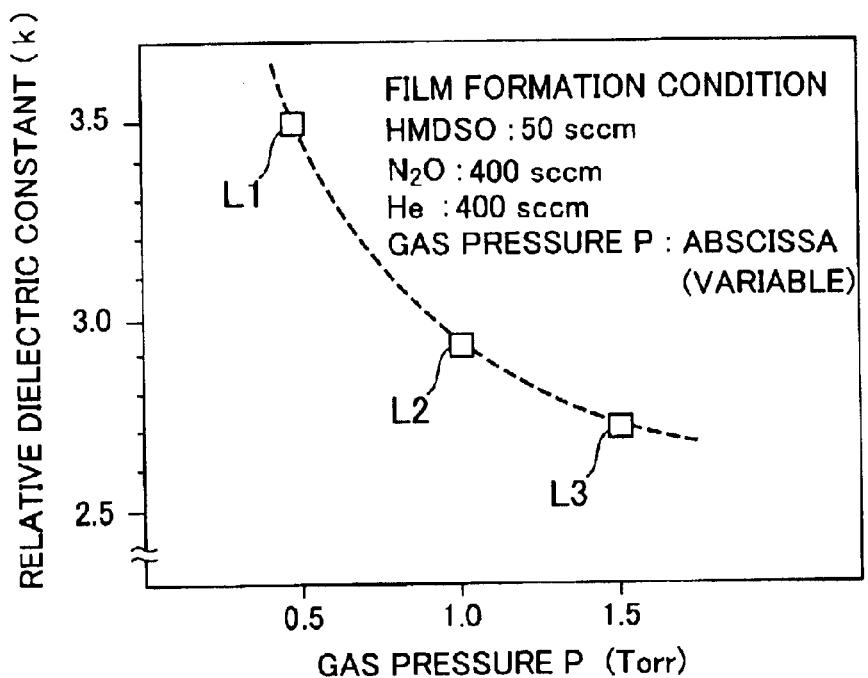
FIG. 15 is a graph illustrating change in relative dielectric constant (k) versus gas pressure for the lowermost of two insulating films relative to type of the underlying film, for underlying films which are prepared under film forming condition IX in accordance with a ninth embodiment of the present invention.

In FIG. 15, the types (L1 to L3) of underlying films prepared by changing the gas pressure P are shown, and the relationship between the gas pressure P and the relative dielectric constant is shown.

Figure 16:
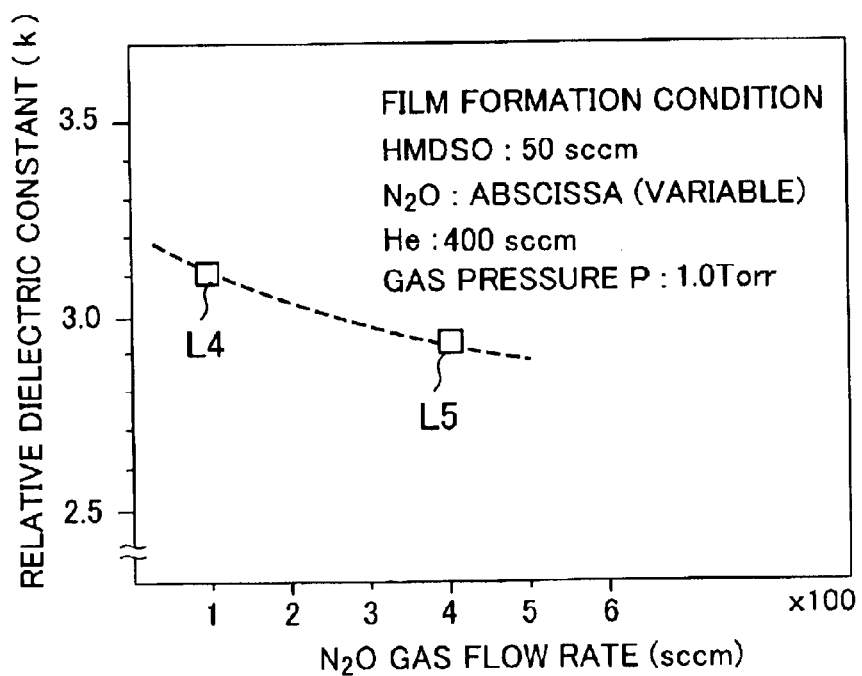
FIG. 16 is a graph illustrating change in relative dielectric constant (k) versus $N_2O$ gas flow rate for the lowermost of two insulating films relative to type of underlying film, for underlying films which are prepared under film forming condition X in accordance with the ninth embodiment of the present invention.

In FIG. 16, the types (L4 and L5) of the underlying films prepared by changing the $N_2O$ gas flow rate are shown, and the relationship between the $N_2O$ gas flow rate and the relative dielectric constant is shown.

Figure 17:
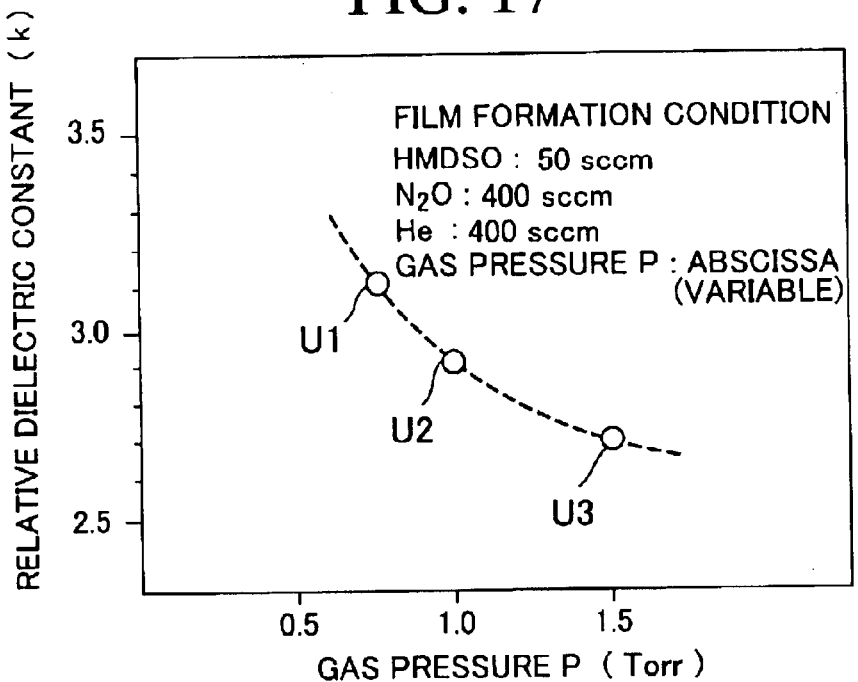
FIG. 17 is a graph illustrating change in relative dielectric constant (k) versus gas pressure for the main insulating film in a composite of two insulating films relative to type of the main insulating film, for main insulating films prepared under film forming condition XI in accordance with the ninth embodiment of the present invention.

In FIG. 17, the types (U1 to U3) of the main insulating films prepared by changing the gas pressure P are shown, and the relationship between the gas pressure P and the relative dielectric constant is shown.

Figure 18:
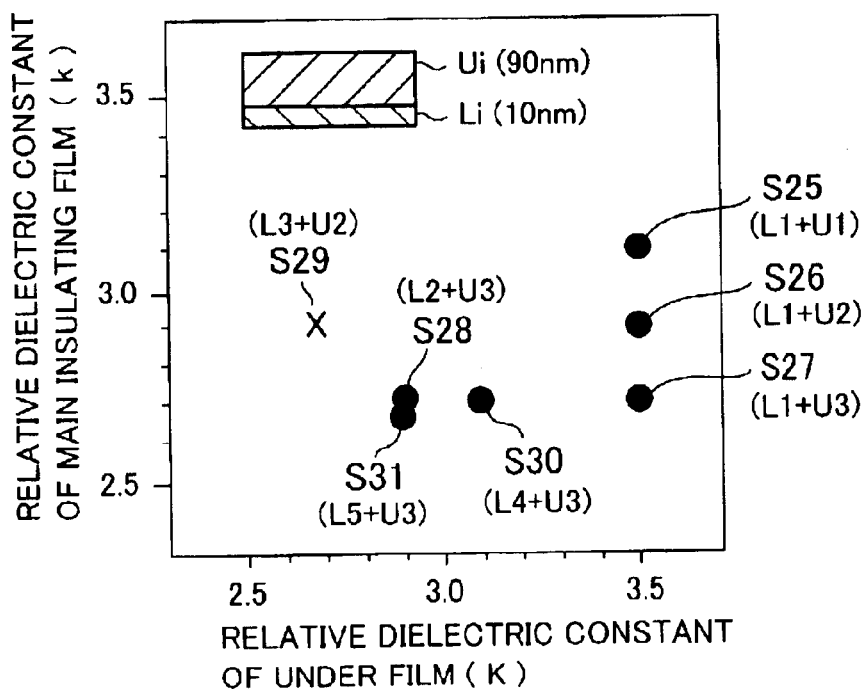
FIG. 18 is a graph illustrating the relationship between dielectric breakdown-resistance, relative dielectric constant (k) of an underlying film, and relative dielectric constant of a main insulating film in a two-layered insulating film prepared under film forming conditions IX, X and XI in accordance with the ninth embodiment of the present invention.

FIG. 18 shows the results for dielectric breakdown-resistance of the two-layered insulating film (S25 to S31) in which the underlying film of FIGS. 15 and 16 and the main insulating film of FIG. 17 are combined.

FIG. 15 is a graph of change in the relative dielectric constant (k) of an underlying film relative to the gas pressure (P) of a film forming gas. In FIG. 15, the ordinate indicates the relative dielectric constant (k) expressed on a linear scale, and the abscissa indicates the gas pressure (P) (Torr) of the film forming gas, which is expressed on a linear scale.

First, the preparation conditions of the samples L1 to L3 used for this investigation will be described. The conditions for the treatment prior to the film formation and the annealing conditions were the same as those of the first embodiment. The film forming conditions were as follows.

(Film Forming Condition IX)
- (i) film forming gas
  - HMDSO flow rate: 50 sccm
  - $N_2O$ flow rate: 400 sccm
  - He gas flow rate: 400 sccm
  - gas pressure (P): 0.5, 1.0 and 1.5 Torr (0.5 Torr for L1, 1.0 Torr for L2, and 1.5 Torr for L3)
- (ii) condition for plasma formation
  - high frequency power (13.56 MHz) PRF: 250 W
  - low frequency power (380 KHz) PLF: 0 W
- (iii) substrate heating temperature: 375° C.
- (iv) formed silicon-containing insulating film (underlying film)

film thickness: 10 nm relative dielectric constant: see FIG. 15

Measurements of the relative dielectric constant were conducted before annealing in the same manner as in the first embodiment.

According to the results shown in FIG. 15, as the gas pressure (P) increases, the relative dielectric constant (k) also increases. When the gas pressure (P) is equal to 0.5 Torr, the relative dielectric constant is about 3.5, and when the gas pressure (P) is 1.0 Torr, the relative dielectric constant is about 2.9, When the gas pressure P is 1.5 Torr, the relative dielectric constant is about 2.7.

FIG. 16 is a graph of change in the relative dielectric constant (k) of the formed underlying film relative to the $N_2O$ gas flow rate in the film forming gas. In FIG. 16, the ordinate indicates the relative dielectric constant (k) expressed on a linear scale, and the abscissa indicates the $N_2O$ gas flow rate (sccm) in the film forming gas, which is expressed on a linear scale.

First, the preparation of the samples L4 and L5 used for this investigation will be described. The conditions of the treatment prior to the film formation and the annealing conditions were the same as those of the first embodiment. The film forming conditions were as follows.

(Film Forming Condition X)
(i) film forming gas
HMDSO flow rate: 50 sccm
$N_2O$ flow rate: 100 and 400 sccm (100 sccm for L4, and 400 sccm for L5)
He gas flow rate: 400 sccm
gas pressure (P): 1.0 Torr
(ii) condition for plasma formation
high frequency power (13.56 MHz) PRF: 250 W
low frequency power (380 KHz) PLF: 0 W
(iii) substrate heating temperature: 375° C.
(iv) formed silicon-containing insulating film (underlying film)
film thickness: 10 nm
relative dielectric constant: see FIG. 16

Measurement of the relative dielectric constant was conducted in the same manner as in the first embodiment before annealing.

According to the results shown in FIG. 16, when the $N_2O$ gas flow rate was 100 sccm, the relative dielectric constant was about 3.1, and when the $N_2O$ gas flow rate was 400 sccm, the relative dielectric constant was about 2.9.

FIG. 17 is a graph of change in relative dielectric constant (k) of a main insulating film relative to gas pressure P of the film forming gas, which is prepared under film forming conditions XI. In FIG. 17, the ordinate indicates the relative dielectric constant (k) expressed on a linear scale, and the abscissa indicates the gas pressure (Torr) of the film forming gas, which is expressed on a linear scale.

First, the preparation of the samples U1 to U3 used for this investigation will be described. The conditions of the treatment prior to the film formation and the annealing conditions were the same as those of the first embodiment. The film forming conditions were as follows.

(Film Forming Condition XI)
(i) film forming gas
HMDSO flow rate: 50 sccm
$N_2O$ flow rate: 400 sccm
He flow rate: 400 sccm
gas pressure (P): 0.5, 1.0 and 1.5 Torr (0.5 Torr for U1, 1.0 Torr for U2, and 1.5 Torr for U3)
(ii) condition for plasma formation
high frequency power (13.56 MHz) PRF: 250 W
low frequency power (380 KHz) PLF: 0 W
(iii) substrate heating temperature: 375° C.
(iv) formed silicon-containing insulating film (main insulating film)
film thickness: 90 nm
relative dielectric constant: see FIG. 17

Measurements of the relative dielectric constant were conducted before annealing in the same manner as in the first embodiment.

According to the results shown in FIG. 17, as to the main insulating film, when the gas pressure was 0.7 Torr, the relative dielectric constant was about 3.1, and when the gas pressure was 1.0 Torr, the relative dielectric constant was about 2.9. When the gas pressure was 1.5 Torr, the relative dielectric constant was about 2.7.

Next, for the two-layered insulating film (S25 to S31) in which the main insulating film (U1 to U3) and the various underlying films (L1 to L5) are combined, the dielectric breakdown-resistance acquired will be described. The insulating film S25 is obtained by combining an underlying film L1 and a main insulating film U1. The insulating film S26 is obtained by combining the underlying film L1 and the main insulating film U2. The insulating film S27 is obtained by combining the underlying film L1 and the main insulating film U3. The insulating film S28 is obtained by combining the underlying film L2 and the main insulating film U3. The insulating film S29 is obtained by combining the underlying film L3 and the main insulating film U2. The insulating film S30 is obtained by combining the underlying film L4 and the main insulating film U3. The insulating film S31 is obtained by combining the underlying film L5 and the main insulating film U3.

FIG. 18 is a graph of dielectric breakdown-resistance acquired for the samples S25 to S31. The abscissa indicates the relative dielectric constant of the underlying film, which is expressed on a linear scale, and the ordinate indicates the relative dielectric constant of the main insulating film, which is also expressed on a linear scale. Measurements of the dielectric breakdown-resistance were conducted according to the same method as used for measurement of leakage current in the first embodiment.

According to FIG. 18, only the sample S29 had insufficient dielectric breakdown-resistance, whereas the samples other than the sample S29 showed sufficient dielectric breakdown-resistance. With respect to the relative dielectric constant of the underlying films, only the sample S29 had a relative dielectric constant as low as 2.7, and whereas the other samples had relative dielectric constants of 2.9 or more. Moreover, with respect to the relative dielectric constant of the main insulating films, the samples S27, S28, S30 and S31 had a relative dielectric constant as low as 2.7, while the other samples had relative dielectric constants of 2.9 or more. In other words, when the relative dielectric constant of the underlying film is low, the dielectric breakdown-resistance tends to decrease irrespective of the magnitude of the relative dielectric constant of the main insulating film. Specifically, this implies that the dielectric breakdown-resistance is dependent on the nature of the underlying film. Therefore, in order to increase the dielectric breakdown-resistance of the two-layered insulating film, the relative dielectric constant of the underlying film must be made higher to some degree.

Based on these results, in order to meet the demand for low relative dielectric constant and high dielectric breakdown-resistance, the insulating film is preferably formed with the underlying film as thin as possible by increasing the relative dielectric constant of the underlying film to some degree and, so that the insulating film has a thickness sufficient to serve as an interlayer insulating film, the relative dielectric constant of the main insulating film is made as low as possible.

Although the invention has been described in detail with reference to the foregoing embodiments, the scope and spirit of the present invention are not limited to the above-described embodiments. It should be understood that various changes, substitutions and alternations can be made hereto without the parting from the spirit and scope of the invention.

For example, in the first embodiment, though hexamethyldisiloxane (HMDSO) is used as the alkyl compound having a siloxane bond, other alkyl compounds having a siloxane bond can be used for example, octamethyl-cyclotetrasiloxane (OMCTS), tetramethyl-cyclotetrasiloxane (TMCTS) or octamethyl-trisiloxane (OMTS).

Moreover, in the first embodiment, though dinitrogen monoxide ($N_2O$) gas is used as the oxygen-containing gas, any one of oxygen ($O_2$), water ($H_2O$) and carbon dioxide ($CO_2$) may be used instead of dinitrogen monoxide ($N_2O$).

In the first to third embodiments, though a hydrocarbon is not used, methane ($CH_4$) or acetylene ($C_2H_2$) may be added.

Furthermore, instead of the alkyl compound having the siloxane bond of the foregoing embodiment, methyl silane or an alkyl compound having an O—Si—O bond can alternatively be used. In this case, any one of monomethyl silane ($SiH_3(CH_3)$), dimethyl silane ($SiH_2(CH_3)_2$), trimethyl silane ($SiH(CH_3)_3$) and tetramethyl silane ($Si(CH_3)_4$) can be used as the methyl silane. As the alkyl compound having an O—Si—O bond, the compound having the structural formula of $CH_3$—O—$Si(CH_3)_2$—O—$CH_3$ can be used.

As described above, according to the present invention, a film forming gas containing an alkyl compound and an oxygen-containing gas is supplied between the first and second electrodes, and the gas pressure is regulated to 1 Torr or less. Thereafter, high frequency power of a frequency of 1 MHz or more is supplied to either of the first and second electrodes, and thus the film forming gas is converted into a plasma state. The alkyl compound and the oxygen-containing gas contained in the plasmanized film forming gas react with each other to form a barrier insulating film covering the copper wiring.

By use of the film forming gas converted into a plasma only by high frequency power, it is possible to achieve a low relative dielectric constant. Moreover, by regulating the pressure of the film forming gas to 1 Torr or less at least at the early stage of the film formation, it is possible to maintain sufficient denseness of the insulating film to prevent copper diffusion.

Moreover, by any one of the following methods or combinations thereof, denseness of the insulating film can be enhanced while maintaining the low relative dielectric constant: the insulating film is formed while gradually increasing the pressure of the film forming gas from a low pressure to a pressure of 1 Torr; the film forming gas containing at least one of ammonia ($NH_3$) and nitrogen ($N_2$) is used for the formation of the insulating film; at least one of ammonia ($NH_3$) and nitrogen ($N_2$) is added to the film forming gas at the early stage of the film formation; the film forming gas containing at least one of He and Ar as a dilution gas is used; the film forming gas containing the dilution gas is used while increasing the flow rate of the dilution gas; and the bias power of the low frequency is applied at the early stage of the film formation.

Moreover, by adding a hydrocarbon, the formed film can be enhanced in etching selectivity for the etchant of the insulating film with the low relative dielectric constant.

What is claimed is:

1. A method of manufacturing a semiconductor device, comprising the steps of:
   providing a supply power source for supplying high frequency power of a frequency of 1 MHz or more to a first electrode;
   placing a substrate on a second electrode facing the first electrode, the substrate having at least one of wiring and a third electrode made mainly of a copper film formed thereon;
   supplying a film forming gas containing a silicon-containing alkyl compound and an oxygen-containing gas between the first and second electrodes, and regulating gas pressure of the film forming gas to 1 Torr or less;
   supplying the high frequency power to the first electrode to convert the film forming gas into a plasma, and allowing the silicon-containing alkyl compound and the oxygen-containing gas to react with each other and thus form a barrier insulating film covering at least one of the wiring and the third electrode; and
   adding ammonia or nitrogen to the film forming gas only during a early portion of the step of converting the film forming gas into a plasma.

2. A method in accordance with claim 1 wherein ammonia is added to the film-forming gas during the early portion of the step of converting the film forming gas into a plasma.

3. A method of manufacturing a semiconductor device, comprising the steps of:
   providing a supply power source for supplying high frequency power of a frequency of 1 MHz or more to a first electrode;
   placing a substrate on a second electrode facing the first electrode, the substrate having at least one of wiring and an a third electrode made mainly of a copper film formed thereon;
   supplying a film forming gas containing a silicon-containing alkyl compound and an oxygen-containing gas between the first and second electrodes, and regulating gas pressure of the film forming gas to 1 Torr or less;
   supplying the high frequency power to the first electrode to convert the film forming gas into a plasma, and allowing the silicon-containing alkyl compound and the oxygen-containing gas to react with each other and thus form a barrier insulating film covering at least one of the wiring and the third electrode; and wherein
   during the forming of the barrier insulating film, gradually increasing the pressure of the film forming gas to 1 Torr from a pressure lower than 1 Torr.

4. A method of manufacturing a semiconductor device, comprising the steps of:
   providing a supply power source for supplying high frequency power of a frequency of 1 MHz or more to a first electrode;
   placing a substrate on a second electrode facing the first electrode, the substrate having at least one of wiring and a third electrode made mainly of a copper film formed thereon;
   supplying a film forming gas containing a silicon-containing alkyl compound and an oxygen-containing gas between the first and second electrodes;

supplying the high frequency power to the first electrode to convert the film forming gas into a plasma, and allowing the silicon-containing alkyl compound and the oxygen-containing gas to react with each other and thus form a barrier insulating film covering at least one of the wiring and the third electrode; and wherein during the forming of the barrier insulating film, maintaining the pressure of the film forming gas at 1 Torr or less in an early stage of formation of the barrier insulating film and maintaining the pressure of the film forming gas at above 1 Torr for the remainder of the formation to completion of the barrier insulating film.

5. A method of manufacturing a semiconductor device, comprising the steps of:

providing a high frequency supply power source for supplying high frequency power of a frequency of 1 MHz or more to a first electrode and a low frequency supply power source for supplying low frequency to a second electrode facing said first electrode;

placing a substrate on said second electrode, the substrate having at least one of wiring and a third electrode made mainly of a copper film formed thereon;

supplying a film forming gas containing a silicon-containing alkyl compound and an oxygen-containing gas between the first and second electrodes, and regulating gas pressure of the film forming gas to 1 Torr or less;

supplying the high frequency power to said first electrode to convert the film forming gas into a plasma, and allowing the silicon-containing alkyl compound and the oxygen-containing gas to react with each other and thus form a barrier insulating film covering at least one of the wiring and the third electrode; and wherein only during an early stage of the forming of the barrier insulating film with supply of high frequency power, supplying the low frequency power, at a frequency of at least 50 kHz and no more than 1 MHz, to the second electrode.

6. A method of manufacturing a semiconductor device, comprising the steps of:

providing a high frequency supply power source for supplying high frequency power of a frequency of 1 MHz or more to a first electrode;

placing a substrate on a second electrode facing the first electrode, the substrate having at least one of wiring and a third electrode made mainly of a copper film formed thereon;

supplying a film forming gas containing a silicon-containing alkyl compound, an oxygen-containing gas and, as a dilution gas, at least one of He and Ar, between the first and second electrodes, and regulating gas pressure of the film forming gas to 1 Torr or less;

supplying the high frequency power to said first electrode to convert the film forming gas into a plasma, and allowing the silicon-containing alkyl compound and the oxygen-containing gas to react with each other and thus form a barrier insulating film covering at least one of the wiring and the third electrode; and wherein during an early stage of the step of forming of the barrier insulating film with supply of high frequency power, maintaining the dilution gas at a flow rate higher than flow rate of dilution gas during remainder of the step of the forming of the barrier insulating film.

7. A method of manufacturing a semiconductor device comprising the steps of:

providing a high frequency supply power source for supplying high frequency power of a frequency of 1 MHz or more to a first electrode;

placing a substrate on a second electrode facing the first electrode, the substrate having at least one of wiring and a third electrode made mainly of a copper film formed thereon;

supplying a film forming gas containing a silicon-containing alkyl compound, an oxygen-containing gas and a hydrocarbon, between the first and second electrodes, and regulating gas pressure of the film forming gas to 1 Torr or less; and supplying the high frequency power to said first electrode to convert the film forming gas into a plasma, and allowing the silicon-containing alkyl compound and the oxygen-containing gas to react with each other and thus form a barrier insulating film covering at least one of the wiring and the third electrode.

8. The method of manufacturing a semiconductor device according to claim 7 wherein the hydrocarbon is methane, acetylene, or ethylene.

9. The method of manufacturing a semiconductor device according to claim 7 wherein the film forming gas additionally contains at least one of He and Ar as a dilution gas.

10. The method of manufacturing a semiconductor device according to claim 9 wherein the dilution gas is He and flow rate of the dilution gas relative to flow rate of the silicon-containing alkyl compound is at least 8:1.

11. The method of manufacturing a semiconductor device according to claim 7 wherein the silicon-containing alkyl compound is selected from the group consisting of hexamethyldisiloxane, octamethylcyclotetrasiloxane, tetramethylcyclotetrasiloxane, and octamethyltrisiloxane.

12. The method of manufacturing a semiconductor device according to claim 7 wherein the silicon-containing alkyl compound is selected from the group consisting of monomethylsilane, dimethylsilane, trimethylsilane, and tetramethylsilane.

13. The method of manufacturing a semiconductor device according to claim 7 wherein the silicon-containing alkyl compound has a O—Si—O bond.

14. The method of manufacturing a semiconductor device according to claim 13 wherein the silicon-containing alkyl compound is $CH_3—O—Si(CH_3)_2—O—CH_3$.

15. The method of manufacturing a semiconductor device according to claim 7 wherein the oxygen-containing gas is selected from the group consisting of $O_2$, $N_2O$, $H_2O$, and $CO_2$.

16. The method of manufacturing a semiconductor device according to claim 15 wherein the oxygen-containing gas is $N_2O$ and flow rate of the oxygen-containing gas relative to flow rate of the silicon-containing alkyl compound is 8:1 or less.

* * * * *